(12) United States Patent
Jung et al.

(10) Patent No.: US 11,309,054 B2
(45) Date of Patent: Apr. 19, 2022

(54) METHOD OF CONTROLLING REPAIR OF VOLATILE MEMORY DEVICE AND STORAGE DEVICE PERFORMING THE SAME

(71) Applicant: Samsung Electronics Co., Ltd., Suwon-si (KR)

(72) Inventors: Wonyeoung Jung, Hwaseong-si (KR); Hyunglae Eun, Seongnam-si (KR); Dong Kim, Hwaseong-si (KR); Inhoon Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 119 days.

(21) Appl. No.: 16/823,720

(22) Filed: Mar. 19, 2020

(65) Prior Publication Data

US 2021/0065835 A1 Mar. 4, 2021

(30) Foreign Application Priority Data

Aug. 30, 2019 (KR) ........................ 10-2019-0107343

(51) Int. Cl.
  *G11C 29/44* (2006.01)
  *G11C 11/406* (2006.01)
  *G11C 11/408* (2006.01)
  *G11C 29/42* (2006.01)

(52) U.S. Cl.
  CPC ........ *G11C 29/4401* (2013.01); *G11C 11/406* (2013.01); *G11C 11/4085* (2013.01); *G11C 29/42* (2013.01)

(58) Field of Classification Search
  CPC ............. G06F 11/1032; G11C 29/4401; G11C 11/406; G11C 11/4085; G11C 29/42; G11C 29/783
  USPC .......................................................... 714/723
  See application file for complete search history.

(56) References Cited

U.S. PATENT DOCUMENTS

| | | | |
|---|---|---|---|
| 8,934,311 | B2 | 1/2015 | Yu et al. |
| 8,996,956 | B2 | 3/2015 | Yang et al. |
| 9,087,613 | B2 | 7/2015 | Sohn et al. |
| 9,268,644 | B1 | 2/2016 | Subramanian et al. |
| 9,659,669 | B2 | 5/2017 | Sohn et al. |
| 9,831,003 | B2 | 11/2017 | Sohn et al. |

(Continued)

FOREIGN PATENT DOCUMENTS

| | | |
|---|---|---|
| JP | 4439539 B2 | 3/2010 |
| KR | 20170134989 A | 12/2017 |

(Continued)

*Primary Examiner* — James C Kerveros
(74) *Attorney, Agent, or Firm* — Muir Patent Law, PLLC

(57) ABSTRACT

A test operation condition of a volatile memory device is set such that an error probability is increased based on the test operation condition, compared to a normal operation condition for a normal operation of the volatile memory device. A test mode is set with respect to a test object region corresponding to at least a portion of a memory cell array included in the volatile memory device. A test operation of the volatile memory device is performed based on the test operation condition during the test mode to detect error position information of errors in data stored in the test object region. A runtime repair operation is performed with respect to the volatile memory device based on the error position information.

20 Claims, 24 Drawing Sheets

(56) References Cited

U.S. PATENT DOCUMENTS

| | | | |
|---|---|---|---|
| 9,953,725 | B2 | 4/2018 | Ryu et al. |
| 9,959,164 | B2 | 5/2018 | Park |
| 10,001,947 | B1 | 6/2018 | Chatterjee et al. |
| 10,347,355 | B2 | 7/2019 | Sohn et al. |
| 2017/0069395 | A1 | 3/2017 | Yao et al. |
| 2017/0192845 | A1* | 7/2017 | Kim .................. G11C 11/40611 |
| 2017/0364407 | A1* | 12/2017 | Osada .................... G11C 29/52 |
| 2018/0173432 | A1 | 6/2018 | Han |
| 2018/0373594 | A1* | 12/2018 | Kim .................... G06F 11/1048 |
| 2019/0050286 | A1 | 2/2019 | Lee et al. |

FOREIGN PATENT DOCUMENTS

| | | |
|---|---|---|
| KR | 20180070974 A | 6/2018 |
| KR | 20190018324 A | 2/2019 |

\* cited by examiner

| DATA BITS | PARITY BITS | | | PARITY O/H | | |
|---|---|---|---|---|---|---|
| | SEC | SEC-DED | DEC | SEC | SEC-DED | DEC |
| 8 | 4 | 5 | 8 | 50.0% | 62.5% | 100% |
| 64 | 7 | 8 | 14 | 10.9% | 12.5% | 21.9% |
| 128 | 8 | 9 | 16 | 6.3% | 7.0% | 12.5% |
| 256 | 9 | 10 | 18 | 3.5% | 3.9% | 7.0% |
| 512 | 10 | 11 | 20 | 2.0% | 2.1% | 3.9% |

| | NOC | TOC |
|---|---|---|
| REFRESH | tREFi | tREFi'(>tREFi) |
| VOLTAGE | PXID | PXID'(<PXID) |
| TIMING | tWR<br>tRRD<br>⋮ | tWR'(<tWR)<br>tRRD'(<tRRD)<br>⋮ |
| ⋮ | ⋮ | ⋮ |

FIG. 15

| PFRADD | EN | ATT |
|--------|----|----|
| RAa | 2 | N/A |
| RAb | 1 | N/A |
| RAc | 5 | ATT1 |
| RAd | 4 | ATT1 |
| RAe | 0 | ATT1 |
| RAf | 2 | N/A |
| ⋮ | ⋮ | ⋮ |

AET1  AET2  AET3  ⋯

FIG. 23

| PFRADD | EN | ATT |
|---|---|---|
| RA1 | 3 | N/A |
| RA2 | 2 | N/A |
| RA4 | 3 | N/A |

AETb

⇩

| PFRADD | EN | ATT |
|---|---|---|
| RA1 | 3 | ATT1 |
| RA2 | 2 | ATT1 |
| RA4 | 3 | ATT1 |
| RA3 | 0 | ATT1 |

AETa

METHOD OF CONTROLLING REPAIR OF VOLATILE MEMORY DEVICE AND STORAGE DEVICE PERFORMING THE SAME

CROSS-REFERENCE TO RELATED APPLICATION

This U.S. non-provisional application claims priority under 35 USC § 119 to Korean Patent Application No. 10-2019-0107343, filed on Aug. 30, 2019, in the Korean Intellectual Property Office (KIPO), the disclosure of which is incorporated by reference herein in its entirety.

BACKGROUND

1. Technical Field

Example embodiments relate generally to semiconductor integrated circuits, and more particularly to a method of controlling repair of a volatile memory device and a storage device performing the method.

2. Discussion of the Related Art

Semiconductor memory devices may be classified into non-volatile memory devices such as a flash memory device and volatile memory devices such as a dynamic random access memory (DRAM) device. The high speed operation and cost efficiency of DRAM provide for their effective use as system memories. Due to the continuing shrinkage in fabrication design rules for DRAM, bit errors in the DRAM memory cells may rapidly increase and yield of the DRAM device may be lowered.

Storage devices such as a solid state drive (SSD) based on a flash memory may be used widely as mass storage medium of a computing device. The SSD may store data in a nonvolatile memory device such as a flash memory device and uses a volatile memory device such as a DRAM device as a buffer memory to manage various information for controlling the flash memory device. When fault is found during manufacturing processes of the DRAM device, fault or failed cells may be repaired through various repair schemes. However, when the fault occurs after the DRAM device is mounted in the SSD and the product is supplied to a user, i.e., after the SSD is used at a user level, the SSD in addition to the DRAM device may not operate correctly.

SUMMARY

Some example embodiments may provide a method of controlling repair of a volatile memory device to enhance reliability of the volatile memory device.

Some example embodiments may provide a storage device having enhanced reliability and lifetime by adopting the method.

According to example embodiments, a method of controlling repair of a volatile memory device including a memory cell array, includes, setting a test operation condition of the volatile memory device such that an error probability is increased based on the test operation condition, compared to a normal operation condition for a normal operation, setting a test mode with respect to a test object region corresponding to at least a portion of the memory cell array, performing a test operation of the volatile memory device based on the test operation condition during the test mode to detect error position information of errors in data stored in the test object region, and performing a runtime repair operation with respect to the volatile memory device based on the error position information.

According to example embodiments, a method of controlling repair of a volatile memory device included in a storage device, includes, setting a test operation condition of the volatile memory device such that an error probability is increased based on the test operation condition, compared to a normal operation condition for a normal operation of the volatile memory device, setting a test mode with respect to a test object region corresponding to at least a portion of a memory cell array included in the volatile memory device, performing a test operation of the volatile memory device based on the test operation condition during the test mode to detect error position information of errors in data stored in the test object region, generating accumulated error information by accumulating the error position information during performing the test operation repeatedly, identifying error attribute information based on the accumulated error information, the error attribute information indicating correlation between the errors and a structure of the volatile memory device, and performing a runtime repair operation with respect to the volatile memory device based on the accumulated error information and the error attribute information. The accumulated error information includes candidate failed row addresses among entire row addresses of the volatile memory device and the number of correctable errors corresponding to the respective candidate failed row addresses.

According to example embodiments, a storage device includes a nonvolatile memory device and a storage controller including a volatile memory device, the storage controller configured to control an access to the nonvolatile memory device and the volatile memory device. The memory storage controller includes an error check and correction (ECC) engine configured to perform error detection and correction with respect to access data of the volatile memory device. The storage controller is configured to set a test operation condition of the volatile memory device such that an error probability is increased based on the test operation condition, compared to a normal operation condition for a normal operation of the volatile memory device, set a test mode with respect to a test object region corresponding to at least a portion of a memory cell array included in the volatile memory device, perform a test operation of the volatile memory device based on the test operation condition during the test mode to detect error position information of errors in data stored in the test object region, and perform a runtime repair operation with respect to the volatile memory device based on the error position information.

The method and the storage device according to example embodiments may efficiently manage the errors to prevent failure of the volatile memory device, and thus performance and lifetime of the volatile memory device and the storage device including the volatile memory device may be enhanced.

BRIEF DESCRIPTION OF THE DRAWINGS

Example embodiments of the present disclosure will be more clearly understood from the following detailed description taken in conjunction with the accompanying drawings.

FIG. 15 is a diagram illustrating an accumulated error table for a method of controlling repair of a volatile memory device according to example embodiments.

FIGS. 22 and 23 are diagrams illustrating a determination of error attribute for a method of controlling repair of a volatile memory device according to example embodiments.

DETAILED DESCRIPTION OF THE EMBODIMENTS

Figure 1:
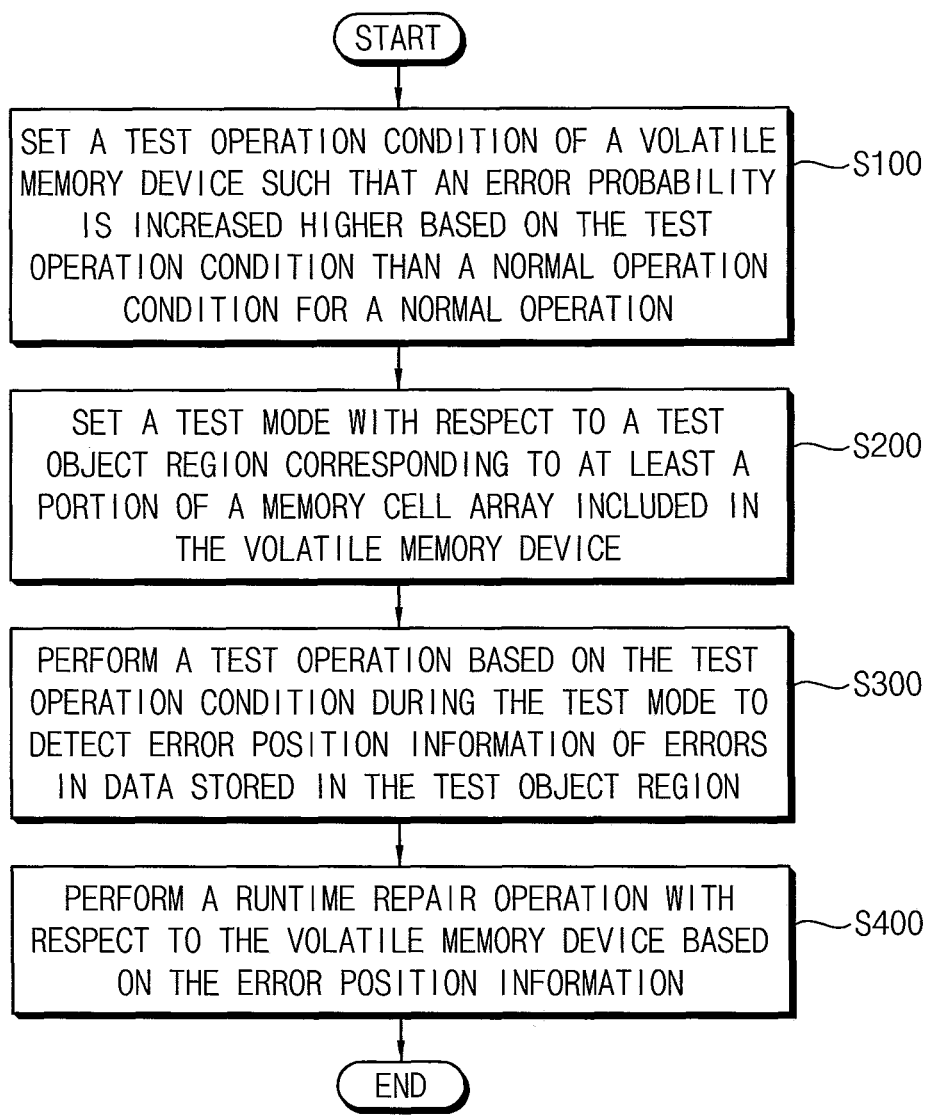
FIG. 1 is a flow chart illustrating a method of controlling repair of a volatile memory device according to example embodiments.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of controlling repair of a volatile memory device according to example embodiments.

Referring to FIG. 1, a test operation condition of a volatile memory device is set such that an error probability is increased higher based on the test operation condition than a normal operation condition for a normal operation or a normal access operation (S100). The normal operation or the normal access operation may refer to one of a read operation and a write operation. The normal operation condition may be predetermined by users or standard specifications. Example embodiments of setting the test operation condition will be described below with reference to FIGS. 7, 8A and 8B.

A test mode is set with respect to a test object region corresponding to at least a portion of a memory cell array included in the volatile memory device (S200). The test object region may be an entire region of the memory cell array or a sub region of the memory cell array. Example embodiments of setting the test object region and the test mode will be described below with reference to FIGS. 6, 9 and 10.

A test operation is performed based on the test operation condition during the test mode to detect error position information such as row address of errors in data stored in the test object region (S300). A runtime repair operation is performed with respect to the volatile memory device based on the error position information (S400).

A defense code scheme such as an additional patrol read operation is being studied so as to enhance reliability of a system including a volatile memory device such as a DRAM. According to conventional schemes, status of memory cells is monitored continuously by scanning a memory region of the DRAM and error positions are analyzed to perform post-package repair (PPR). In case of progressive failure related with reliability of the DRAM, the potential errors may not be revealed during the normal operation. It takes a relatively long time to collect and accumulate error information and analyze the errors because the entire memory cells have to be scanned repeatedly. If the time for scanning and analyzing is increased, uncorrectable errors, that is, failure of the volatile memory device may occur before performing the PPR, and then the data stored in the volatile memory device may be lost or and the system using the volatile memory device may be shut down.

According to example embodiments, the potential failure may be detected and repaired in advance by setting the test operation condition to cause the increased error probability higher than the normal operation condition, for example, through a failure acceleration scheme.

As such, the method and the storage device according to example embodiments may efficiently manage the errors to prevent failure of the volatile memory device, and thus performance and lifetime of the volatile memory device and the storage device including the volatile memory device may be enhanced.

Figures 2, 3:
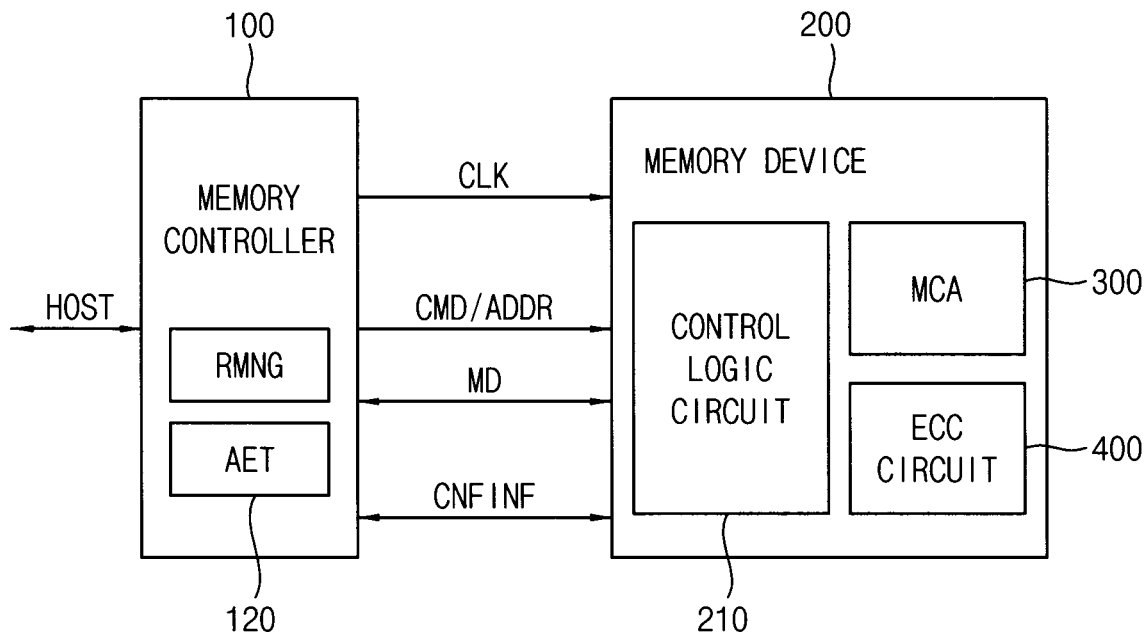
FIG. 2 is a block diagram illustrating a memory system according to example embodiments.
FIG. 3 is a diagram illustrating on-die ECC levels according to data bits and parity bits.

FIG. 2 is a block diagram illustrating a memory system according to example embodiments.

Figure 24:
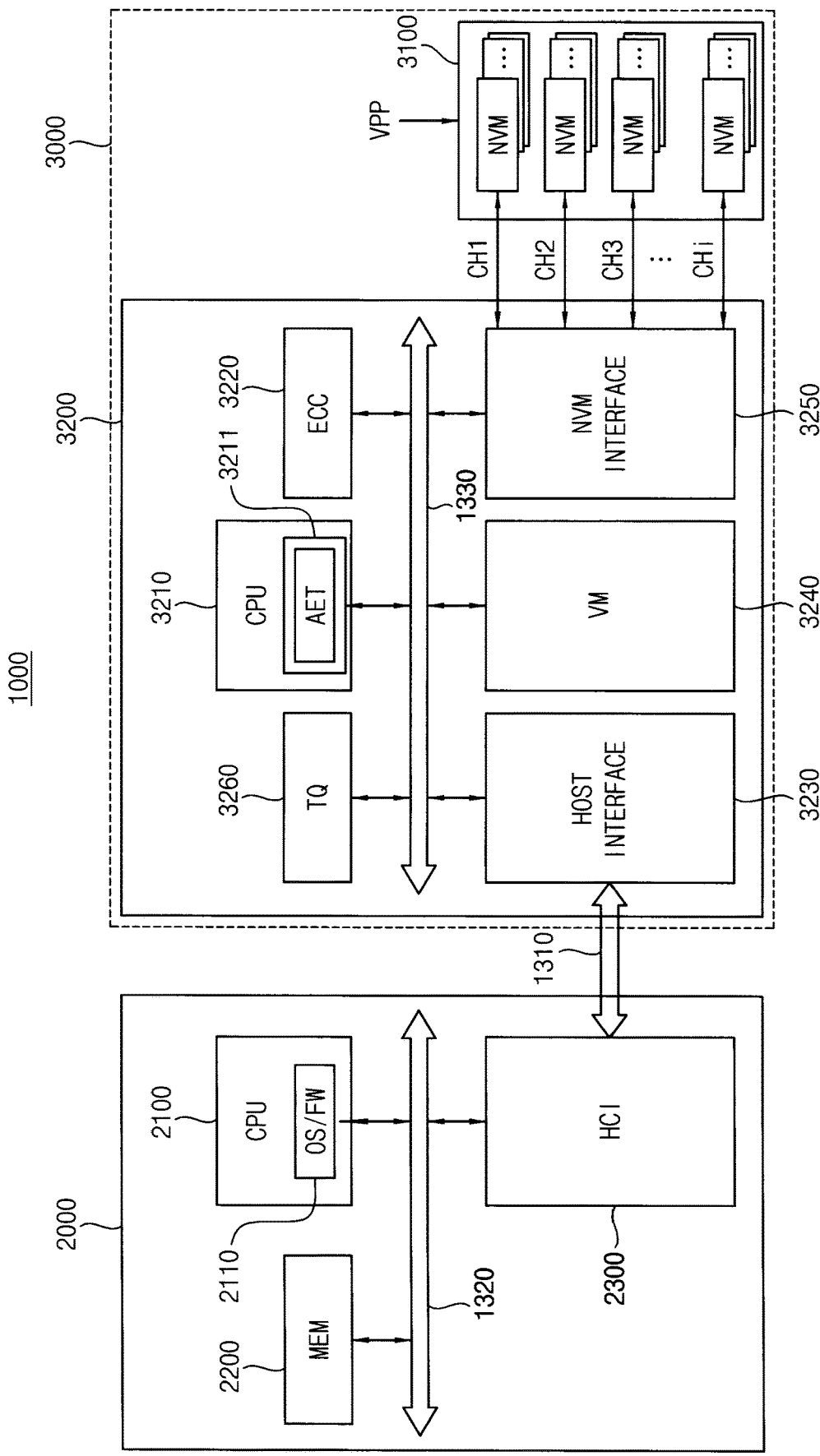
FIG. 24 is a block diagram illustrating a storage device according to example embodiments.

Referring to FIG. 2, a memory system 20 includes a memory controller 100 and a volatile memory device 200. In some embodiments, the memory system 20 may be a storage device 3000 as shown in FIG. 24.

The memory controller 100 may control an overall operation of the memory system 20, and the memory controller 100 may control an overall data exchange between an external host device and the volatile memory device 200. For example, the memory controller 100 may write data in the volatile memory device 200 or read data from the volatile memory device 200 in response to a request from the external host device. In addition, the memory controller 100 may issue operation commands to the volatile memory device 200 for controlling the volatile memory device 200.

In some example embodiments, the volatile memory device 200 may be a volatile memory such as a dynamic random access memory (DRAM), a synchronous DRAM (SDRAM), a low power double data rate (LPDDR) SDRAM, etc. The example embodiments are not limited to a particular type of memory and may be applied to any type of memory requiring repair operations adopting a post-package repair (PPR) scheme.

The memory controller 100 transmits a clock signal CLK, a command CMD, and an address (signal) ADDR (CMD/ADDR) to the volatile memory device 200 and exchanges data MD with the volatile memory device 200.

The volatile memory device 200 includes a memory cell array (MCA) 300 that stores the data MD, an error correction code or error check and correction (ECC) circuit 400, and a control logic circuit 210. FIG. 2 illustrates that the ECC circuit 400 is included in the volatile memory device 200, however, according to another example embodiment, the ECC circuit 400 may be included in the memory controller 100.

The memory controller 100 may include a repair manager RMNG configured to perform a method of controlling repair of a volatile memory device according to example embodiments. For example, the repair manager RMNG may be configured to perform the method of FIG. 1. For example, the repair manager RMNG may control the patrol read operation, generate the accumulated error information and determine the error attribute. The runtime repair operation may be controlled by the repair manager RMNG or by the external host device. In some example embodiments, the repair manager RMNG may store and manage the accumulated error information in an accumulated error table AET 120 based on information CNFINF provided from the volatile memory device 200. FIG. 2 illustrates that the AET 120 is included in the memory controller 100, however, example embodiments are not limited thereto. Example embodiments of the AET 120 will be described below with reference to FIG. 15.

In some example embodiments, the volatile memory device 200 may provide information CNFINF on its configuration to the memory controller 100. In this case, the repair manager RMNG in the memory controller 100 may determine the error attribute based on the information CNFINF provided from the volatile memory device 200.

FIG. 3 is a diagram illustrating on-die ECC levels according to data bits and parity bits.

In FIG. 3, SEC represents single error correction, DED represents double error detection, and DEC represents double error correction. FIG. 3 illustrates parity bits and corresponding size overheads of the parity bits (PARITY O/H). The parity bits correspond to a Hamming code or an extended Hamming code. The size overhead of the parity bits corresponds to a ratio of the parity bits of the parity data corresponding to the write data to the number of data bits of the write data. The cases in FIG. 3 are non-limiting examples. For example, the number of parity bits and the size overhead may be determined differently if Bose-Chaudhuri-Hocquenghem (BCH) code, Reed-Solomon code, etc. are used.

As illustrated in FIG. 3, as the number of parity bits is increased with respect to the same number of data bits, e.g., as the ratio of the number of parity bits to the number of data bits is increased, a capability of error detection and correction is increased. As the number of data bits is increased with respect to the same capability of error detection and correction, the corresponding number of parity bits is increased but the ratio of the number of parity bits to the number of data bits is decreased.

As such, the error detection capability and/or the error correction capability may be increased as the ratio of the number of parity bits to the corresponding number of data bits is increased. As a result, the on-die ECC level may be increased as the ratio of the number of parity bits to the corresponding number of data bits is increased. However, the error correction capability is limited because the real memory capacity is decreased as the number of parity bits is increased.

According to example embodiments, the failure of the volatile memory device may be prevented by performing the runtime repair operation based on the accumulated error information and the error attribute with a relatively low error correction capability. Here, the failure of the volatile memory device indicates that an error uncorrectable by the ECC function is occurred in the volatile memory device.

Figure 4:
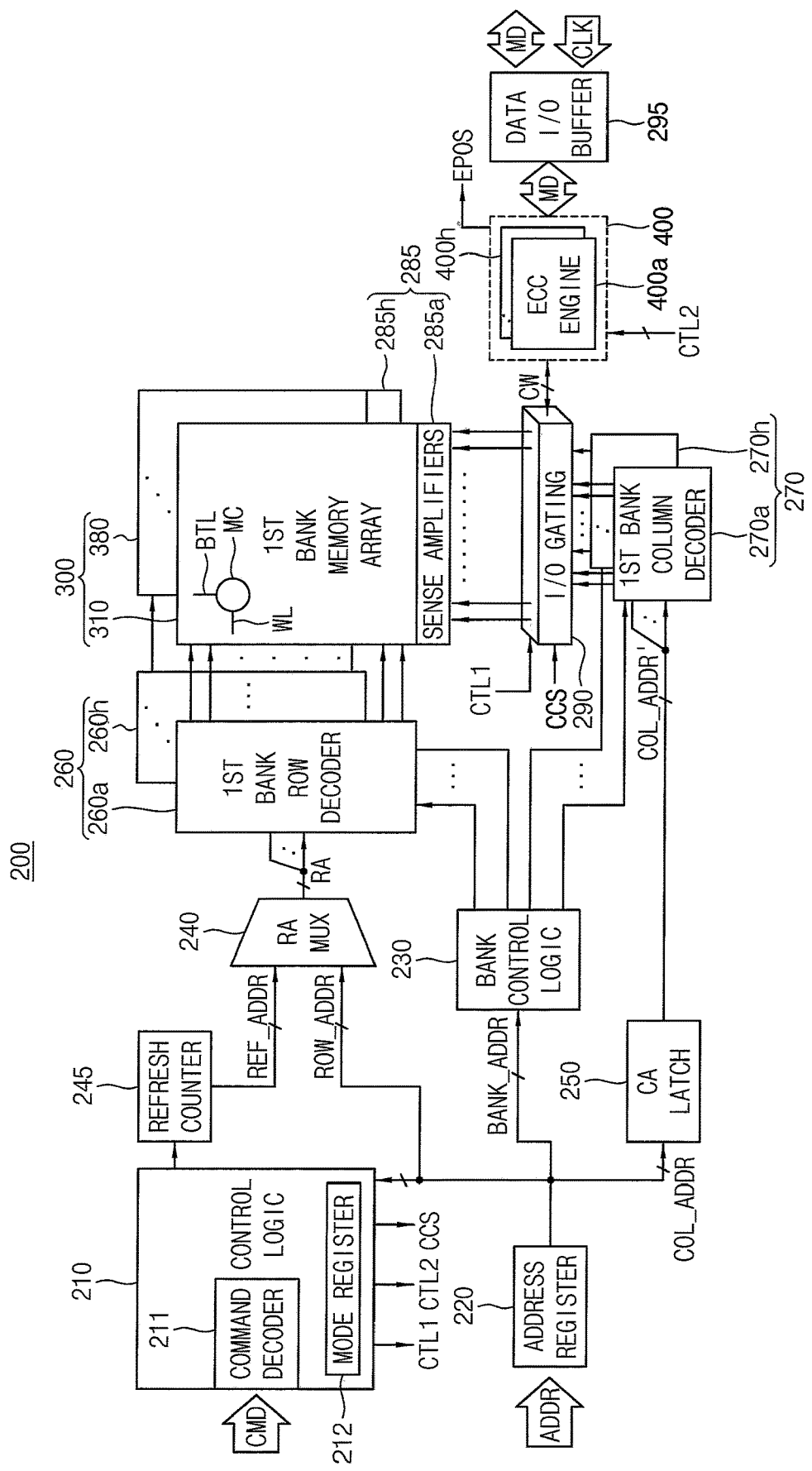
FIG. 4 is a block diagram illustrating a volatile memory device according to example embodiments.

FIG. 4 is a block diagram illustrating a volatile memory device according to example embodiments. FIG. 4 illustrates a dynamic random access memory (DRAM) device as an example.

Referring to FIG. 4, a volatile memory device 200 may include a control logic circuit 210, an address register 220, a bank control logic 230, a refresh counter 245, a row address multiplexer 240, a column address latch 250, a row decoder 260, a column decoder 270, the memory cell array 300, a sense amplifier unit 285, an I/O gating circuit block 290, the ECC circuit 400, and a data I/O buffer 295.

The ECC circuit 400 includes first through eighth ECC engines 400a~400h, and the I/O gating circuit block 290 includes a plurality of I/O gating circuits corresponding to a plurality of bank memory arrays.

The memory cell array 300 includes first through eighth bank memory arrays 310~380. The row decoder 260 includes first through eighth bank row decoders 260a~260h respectively coupled to the first through eighth bank memory arrays 310~380, the column decoder 270 includes first through eighth bank column decoders 270a~270h respectively coupled to the first through eighth bank memory arrays 310~380, and the sense amplifier unit 285 includes first through eighth bank sense amplifiers 285a~285h respectively coupled to the first through eighth bank memory arrays 310~380. The first through eighth bank memory arrays 310~380, the first through eighth bank row decoders 260a~260h, the first through eighth bank column decoders 270a~270h, and the first through eighth bank sense amplifiers 285a~285h may form first through eighth banks. Each of the first through eighth bank memory arrays 310~380 includes a plurality of memory cells MC formed at intersections of a plurality of word-lines WL and a plurality of bit-line BTL.

The address register 220 receives the address ADDR including a bank address BANK_ADDR, a row address ROW_ADDR, and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh counter 245. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The activated one of the first through eighth bank row decoders 260a~260h decodes the row address RA that is output from the row address multiplexer 240, and activates a word-line of a bank memory array corresponding to the row address RA. For example, the activated bank row decoder applies a word-line driving voltage to the word-line corresponding to the row address RA. The column address latch 250 receives the column address COL_ADDR from the address register 220, and temporarily stores the received column address COL_ADDR. In some example embodiments, in a burst mode, the column address latch 250 generates column addresses that increment from the received column address COL_ADDR. The column address latch 250 applies the temporarily stored or generated column address COL_ADDR' to the first through eighth bank column decoders 270a~270h.

The activated one of the first through eighth bank column decoders 270a~270h activates a sense amplifier corresponding to the bank address BANK_ADDR and the column address COL_ADDR' through the I/O gating circuit block 290. Each of the I/O gating circuits in the I/O gating circuit block 290 includes circuitry for gating input/output data, and further includes read data latches for storing data that is output from the first through eighth bank memory arrays 310~380 and write drivers for writing data to the first through eighth bank memory arrays 310~380.

A codeword CW read from one bank memory array of the first through eighth bank memory arrays 310~380 is sensed by a sense amplifier coupled to the one bank memory array from which the data is to be read, and is stored in the read data latches. The codeword CW stored in the read data latches may be provided to the memory controller 100 via the data I/O buffer 295 after ECC decoding is performed on the codeword CW by a corresponding ECC engine. The data MD to be written in one bank memory array of the first through eighth bank memory arrays 310~380 may be provided to the data I/O buffer 295 from the memory controller 100, and written in the one bank memory array by the write drivers after an ECC encoding is performed on the data MD by a corresponding ECC engine.

The data I/O buffer 295 may provide the data MD from the memory controller 100 to the ECC circuit 400 in a write operation of the volatile memory device 200, based on the clock signal CLK, and may provide the data MD from the ECC circuit 400 to the memory controller 100 in a read operation of the volatile memory device 200.

The ECC circuit 400, in the write operation, generates parity data (e.g., parity bits) based on the main data MD from the data I/O buffer 295, and provides the I/O gating circuit block 290 with the codeword CW including the main data MD and the parity bits. The I/O gating circuit block 290 may write the codeword CW in one bank memory array.

In addition, the ECC circuit 400, in the read operation, may receive the codeword CW, read from one bank memory array, from the I/O gating circuit block 290. The ECC circuit 400 may perform an ECC decoding on the data MD based on the parity bits in the codeword CW, may correct a single bit error or double bit error in the data MD, and may provide corrected main data to the data I/O buffer 295. Also the ECC circuit 400 may provide error position information EPOS indicating positions (e.g., addresses) of the errors through the ECC decoding, and the error position information EPOS may be provided to the repair manager RIVING in the memory controller 100.

The control logic circuit 210 may control operations of the volatile memory device 200. For example, the control logic circuit 210 may generate control signals for the volatile memory device 200 to perform a write operation or a read operation. The control logic circuit 210 includes a command decoder 211 that decodes the command CMD received from the memory controller 100 and a mode register 212 that sets an operation mode of the volatile memory device 200. For example, a value of the mode register 212 may indicate the operation mode.

For example, the command decoder 211 may generate the control signals corresponding to the command CMD by decoding a write enable signal (/WE), a row address strobe signal (/RAS), a column address strobe signal (/CAS), a chip select signal (/CS), etc. The control logic circuit 210 may generate a column control signal CCS and a first control signal CTL1 to control the I/O gating circuit block 290 and a second control signal CTL2 to control the ECC circuit 400.

Figure 5:
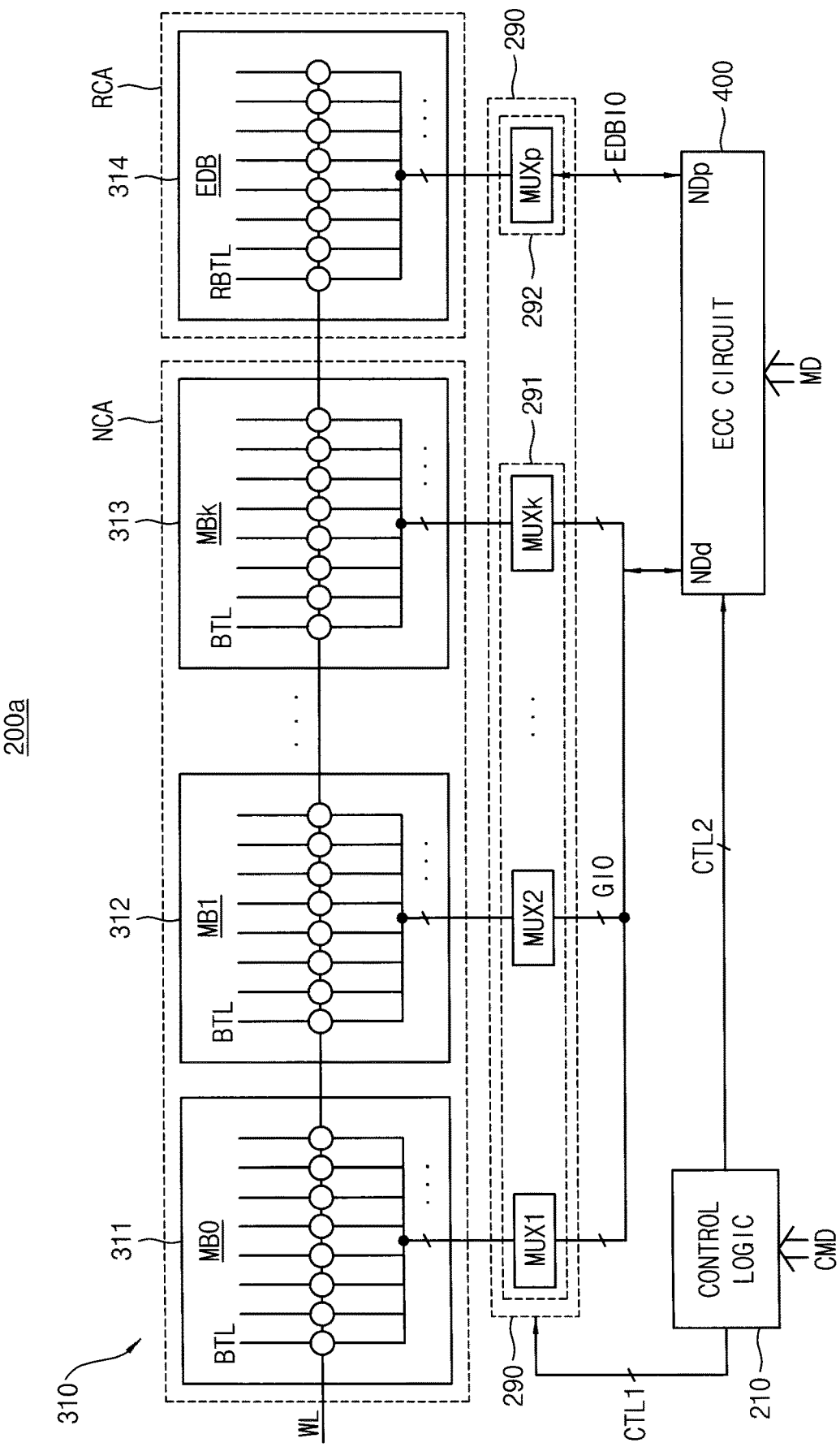
FIG. 5 is a diagram illustrating a portion of the volatile memory device of FIG. 4.

FIG. 5 is a diagram illustrating a portion of the volatile memory device of FIG. 4.

Referring to FIG. 5, a volatile memory device 200a may include the control logic 210, the first bank memory array 310, the I/O gating circuit 290, and the ECC circuit 400. The first bank memory array 310 may include a normal cell array NCA and a redundancy cell array RCA. The normal cell array NCA may include a plurality of first memory blocks MB0~MBk, e.g., 311~313, and the redundancy cell array RCA may include at least a second memory block EDB, e.g., 314. The first memory blocks 311~313 are memory blocks determining a memory capacity of the volatile memory device 200a. The second memory block 314 is for ECC and/or redundancy repair. Since the second memory block 314 for ECC and/or redundancy repair is used for ECC, data line repair, or block repair to repair one or more failed cells generated in the first memory blocks 311~313, the second memory block 314 is also referred to as an EDB block.

In each of the first memory blocks 311~313, a plurality of first memory cells are arrayed in rows and columns. In the second memory block 314, a plurality of second memory cells are arrayed in rows and columns. The first memory cells and the second memory cells connected to intersections of the word lines WL and bit lines BTL (for the first memory blocks 311~313) and RBTL (for the second memory block 314) may be dynamic memory cells.

The I/O gating circuit 290 may include a first switching circuit 291 connected to the first memory blocks 311~313 and a second switching circuit 292 connected to the second memory block 314. The first switching circuit 291 may include a plurality of column selectors MUX1~MUXk and the second switching circuit 292 may include a column selector MUXp. In the volatile memory device 200a, bit lines corresponding to data of a burst length (BL) may be simultaneously accessed to support the BL indicating the maximum number of column positions that is accessible. For example, the BL may be set to 8. In this case, each of the bit lines BTL and RBTL may be connected to a corresponding one of column selectors MUX1~MUXk and MUXp.

The ECC circuit 400 may be connected to the first and second switching circuits 291 and 292 through first data lines GIO and second data lines EDBIO, respectively. The first data lines GIO may be connected to data nodes NDd of the ECC circuit 400 and the second data lines EDBIO may be connected to parity nodes NDp of the ECC circuit 400.

The control logic circuit 210 may decode the command CMD to generate the first control signal CTL1 for controlling the first and second switching circuits 291 and 292 and the second control signal CTL2 for controlling the ECC circuit 400.

An ECC unit that is an object of each ECC operation may be determined as various combinations of data corresponding to the same row address. If the ECC unit includes errors more than a correctable number, the data may be lost permanently to cause critical damage to a system using the volatile memory device. According to example embodiments, the runtime repair operation may be performed by efficiently managing the correctable errors, before the uncorrectable errors are occurred.

Figures 6, 7:
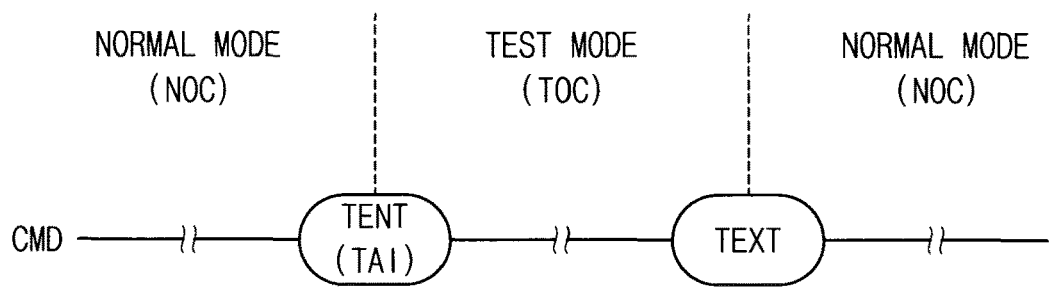
FIG. 6 is a diagram illustrating a control of a test mode of a volatile memory device according to example embodiments.
FIG. 7 is a diagram illustrating a test operation condition for a test operation of a volatile memory device according to example embodiments.

FIG. 6 is a diagram illustrating a control of a test mode of a volatile memory device according to example embodiments.

Referring to FIG. 6, a volatile memory device may start the test mode based on a test enter command TENT provided from a memory controller to the volatile memory device. In addition, the volatile memory device may complete the test mode based on a test exit command TEXT provided from the memory controller to the volatile memory device. The volatile memory device may perform a test operation based on a test operation condition TOC during the test mode to detect error position information of errors in data stored in a test object region of the memory cell array. The volatile memory device may perform a normal operation based on a normal operation condition NOC during a normal mode with respect to the regions except the test object region. As will be further described below with reference to FIG. 7, the test operation condition TOC may be set such that an error probability is increased higher based on the test operation condition TOC than the normal operation condition NOC. The normal operation condition NOC and the test operation condition TOC may be provided through a mode register set (MRS) command from the memory controller to the volatile memory device to be stored in the mode register 212 in FIG. 4.

In some example embodiments, the test enter command TENT may include a test address information TAI indicating the test object region. The test address information TAI may be included inside the test enter command TENT or may be provided through designated data lines while the test enter command TENT is provided through command-address lines.

FIG. 7 is a diagram illustrating a test operation condition for a test operation of a volatile memory device according to example embodiments.

Referring to FIG. 7, a test operation condition TOC according to example embodiments may be related with refresh, voltage, timing, and so on. Also the normal operation condition NOC is illustrated in FIG. 7 for comparison with the test operation condition TOC.

In some example embodiments, a test refresh interval time tREFi' for the test operation that is longer than a normal refresh interval time tREFi for the normal operation may be set as the test operation condition TOC.

The normal refresh interval time tREFi may represent an average time between consecutive two refresh operations of the two rows in the same memory bank. For example, the normal refresh interval time tREFi may be 7.8 μs (microsecond) and a refresh cycle time tRFC for the refresh operation of each row may be 350 ns (nanosecond) in case of 8 Gb DDR4 (double data rate 4) DRAM (dynamic random access memory). In this case, the memory controller may issue the refresh command per 7.8 μs and wait for 350 ns after issuing each refresh command to access the volatile memory device. In some example embodiments, the normal refresh interval time tREFi may be varied depending on the operational temperature of the memory device. The normal refresh interval time tREFi may be decreased as the operational temperature of the memory device is increased. As the normal refresh interval time tREFi is increased, the electric charges stored in the memory cells are discharged more and the error probability is increased for the memory cells having weak retention capability. As such, the potential failure may be accelerated by increasing the refresh interval time in the test mode longer than the normal mode.

In some example embodiments, a test selected wordline voltage PXID' for the test operation that is lower than a normal selected wordline voltage PXID for the normal operation may be set as the test operation condition TOC. As the selected wordline voltage is decreased, the electric charge stored in the memory cell during the write operation is decreased, the electric charge developed from the memory cell to the bitline during the read operation is decreased, and thus the error probability is increased. As such, the potential failure may be accelerated by decreasing the selected wordline voltage in the test mode lower than the normal mode.

In some example embodiments, a test timing parameter for the test operation that is smaller than a normal timing parameter for the normal operation may be set as the test operation condition TOC. FIG. 7 illustrates two timing parameters tWR and tRRD as examples, and the timing parameter may include other various values as will be described below with reference to FIGS. 8A and 8B. As such, the potential failure may be accelerated by decreasing the timing parameter in the test mode smaller than the normal mode.

Figure 8A:
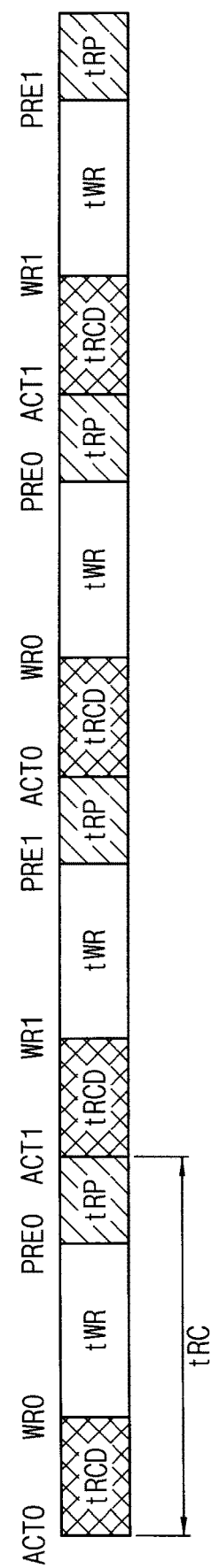
FIGS. 8A and 8B are diagrams illustrating operation parameters of a volatile memory device according to example embodiments.
Figure 8B:
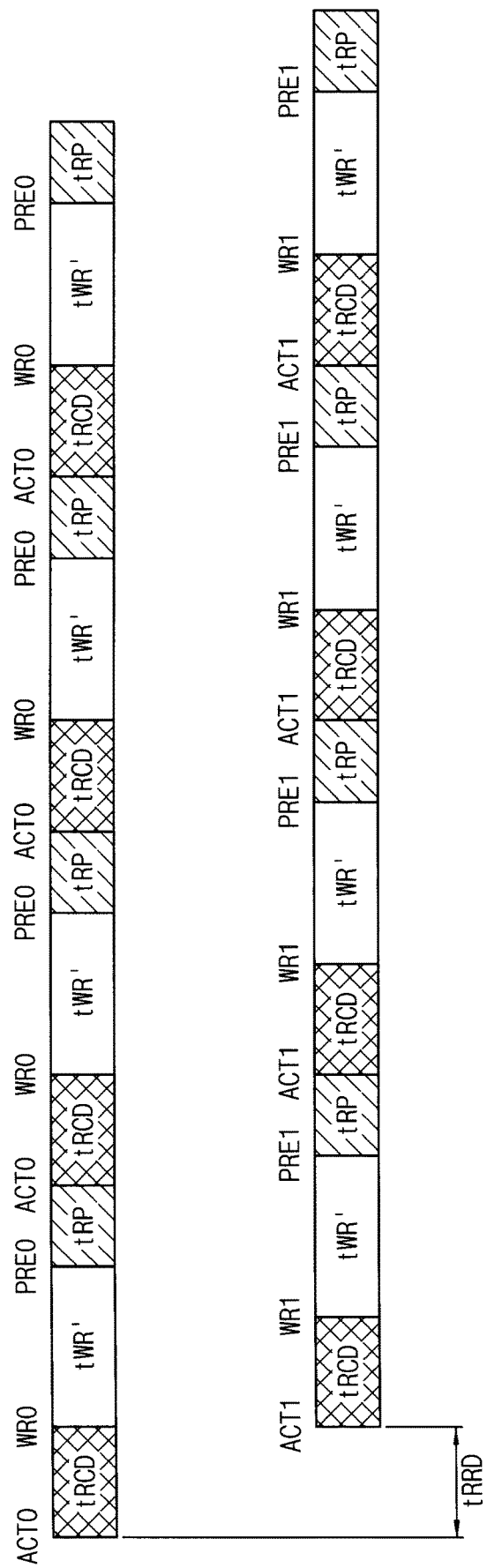

FIGS. 8A and 8B are diagrams illustrating operation parameters of a volatile memory device according to example embodiments.

In a volatile memory device, timing parameters may include a row cycle time tRC, a /RAS-to-/CAS time tRCD, a write recovery time tWR, a row precharge time tRP, and a row active-to-row active time tRRD, and so on.

The row cycle time tRC represents a time between an active command and a next active command. The /RAS-to-/CAS time tRCD represents a time between the applying of a /RAS signal and the applying of a /CAS signal, for example, a time between a row active command and a column active command. The write recovery time tWR represents a time between the enabling of a word line and the writing of data to a memory cell. The row precharge time tRP represents a time between the write recovery time tWR and the precharging of a bit line in order to prepare a next active command. The row active-to-row active time tRRD represents a time between a row active command and a row active command, such as, for example, a row active-to-row active time between different sub-banks.

For example, as the write recovery time tWR increases, a data write time to a memory cell may increase. Accordingly, the volatile memory device may obtain a sufficient time margin needed to write data.

Referring to FIG. 8A, in a bank interleaving method, the first through eighth banks operate in an interleaved manner, that is, continuously, one bank-by-one bank. The bank interleaving method may include an operation of, for example, the first bank and an operation of any one bank from among the banks other than the first bank. For example, operations on the different banks may alternate, so that a row cycle of the first bank occurs, then a row cycle of the second bank occurs, and then the alternating pattern repeats. Alternatively, the bank interleaving method may include an operation of the first bank and an operation of the first bank. The bank interleaving method of FIG. 8A corresponds to a continuous operation of the first bank.

A first active command ACT0 for the first bank is applied, a /RAS-to-/CAS time tRCD elapses, and a first word line WL0 is enabled. The first word line WL0 is connected to selected memory cells in the first bank. A data write operation WR0 to the selected memory cells connected to the first word line WL0 is performed. A data write operation WR0 of the selected memory cells connected to the first word line WL0 in the first bank is performed for a write recovery time tWR. After the write recovery time tWR elapses, bit lines of the memory cells in the first bank may be precharged due to a first precharge command PRE0. A bit line precharge operation of the first bank is performed for a row precharge time tRP. A first write operation of the first bank is performed for tRCD+tWR+tRP in total.

Next, a second active command ACT1 for the first bank is applied, a /RAS-to-/CAS time tRCD elapses, and a second word line WL1 is enabled. The second word line WL1 is connected to selected memory cells in the first bank. A data write operation WR1 to the selected memory cells connected to the second word line WL1 is performed. A data write operation WR1 of the selected memory cells connected to the second word line WL1 in the first bank is performed for a write recovery time tWR. After the write recovery time tWR elapses, bit lines of the memory cells in the first bank may be precharged due to a second precharge command PRE1. A bit line precharge operation of the first bank is performed for a row precharge time tRP. A second write operation of the first bank is performed for tRCD+tWR+tRP in total. Additional write operations may then be performed for additional word lines WL2, WL3, etc.

In the bank interleaving method, the first write operation and the second write operation of the first bank are each performed at a tRC interval that corresponds to tRCD+tWR+tRP. A row cycle time tRC may be, for example, about 50 ns or more.

Referring to FIG. 8B, in a sub-bank interleaving method, the first and second sub-banks in each of the banks operate in an interleaved manner, for example, continuously, with overlapping but out of phase cycles. The sub-bank interleaving method may be explained with reference to, for example, operations of the first and second sub-banks of the first bank. It is assumed that a first active command ACT0 is for the first sub-bank and a second active command ACT1 is for the second sub-bank. The first active command ACT0 for the first sub-bank is applied, a /RAS-to-/CAS time tRCD elapses, and a first word line WL0 of the first sub-bank is enabled. The first word line WL0 is connected to selected memory cells in the first sub-bank. A data write operation WR0 is performed on the selected memory cells connected to the first word line WL0. A data write operation WR0 of the first sub-bank is performed for a write recovery time tWR'. After the write recovery time tWR' elapses, bit lines of the memory cells in the first sub-bank may be precharged due to a first precharge command PRE0. A bit line precharge operation of the first sub-bank is performed for a row precharge time tRP. Next, the first active command ACT0 for the first sub-bank may be applied again, the second word line WL1 of the first sub-bank may be enabled, a data write operation WR0 may be performed on the selected memory cells connected to the second word line WL1, and a bit line precharge operation may be performed, etc. This process may be repeated for a number of cycles for writing to additional word lines of the first sub-bank.

The second active command ACT1 for the second sub-bank is applied, a /RAS-to-/CAS time tRCD elapses, and a first word line WL0 of the second sub-bank is enabled. The first word line WL0 is connected to selected memory cells in the second sub-bank. A data write operation WR1 is performed on the selected memory cells connected to the first word line WL0 in the second sub-bank. A data write operation WR1 of the memory cells connected to the first word line WL0 in the second sub-bank is performed for a write recovery time tWR'. After the write recovery time tWR' elapses, bit lines of the memory cells in the second sub-bank may be precharged due to a second precharge command PRE1. A bit line precharge operation of the second sub-bank is performed for a row precharge time tRP. Next, the second active command ACT1 for the second sub-bank may be applied again, a second word line WL1 of the second sub-bank may be enabled, a data write operation WR1 of the memory cells connected to the second word line WL1 in the second sub-bank may be performed, and a bit line precharge operation of the second sub-bank may be performed, etc. This process may be repeated for a number of cycles for writing to additional word lines of the second sub-bank.

In the sub-bank interleaving method, the first active command ACT0 for the first sub-bank and the second active command ACT1 for the second sub-bank may be applied at a tRRD interval, which corresponds to a row active-to-row active time between different sub-banks. The row active-to-row active time tRRD may be, for example, about 6 ns or more.

Since, in the bank interleaving method, two word lines may not be enabled in one bank, for example, the first bank, a continuous data write operation of the first bank may be performed at a tRC interval. However, in the sub-bank interleaving method, a data write operation with respect to the first and second sub-banks in the first bank may be performed at a tRRD interval. The row active-to-row active time tRRD may be much shorter than the row cycle time tRC. Accordingly, in the sub-bank interleaving method, since a continuous data write operation is performed at a tRRD interval, a memory cell data write time tWR' in each data write operation may increase.

Figure 9:
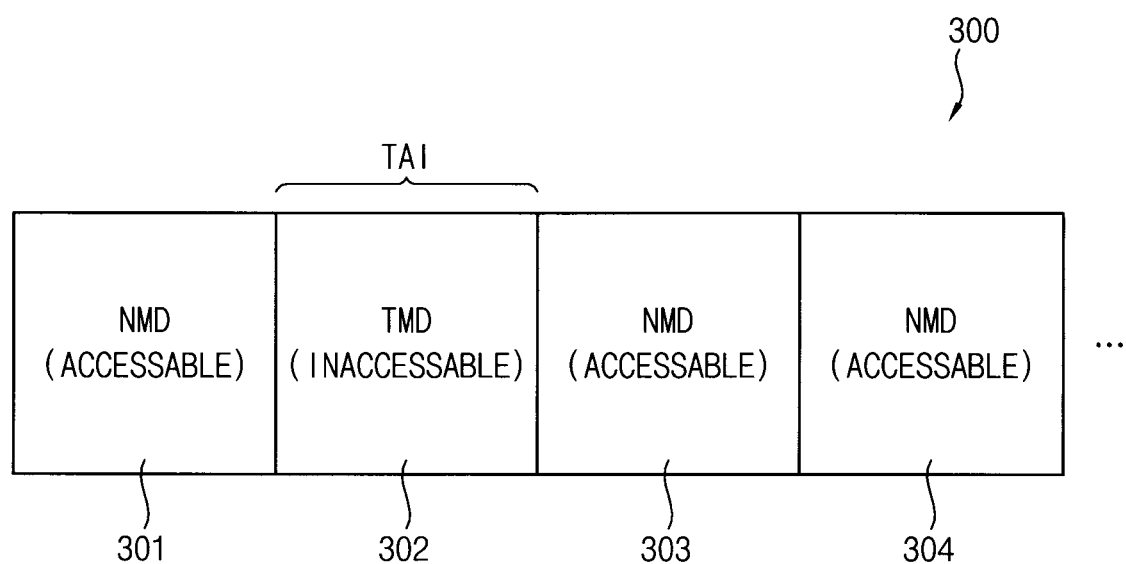
FIGS. 9 and 10 are diagrams illustrating setting a test object region for a method of controlling a volatile memory device according to example embodiments.
Figure 10:
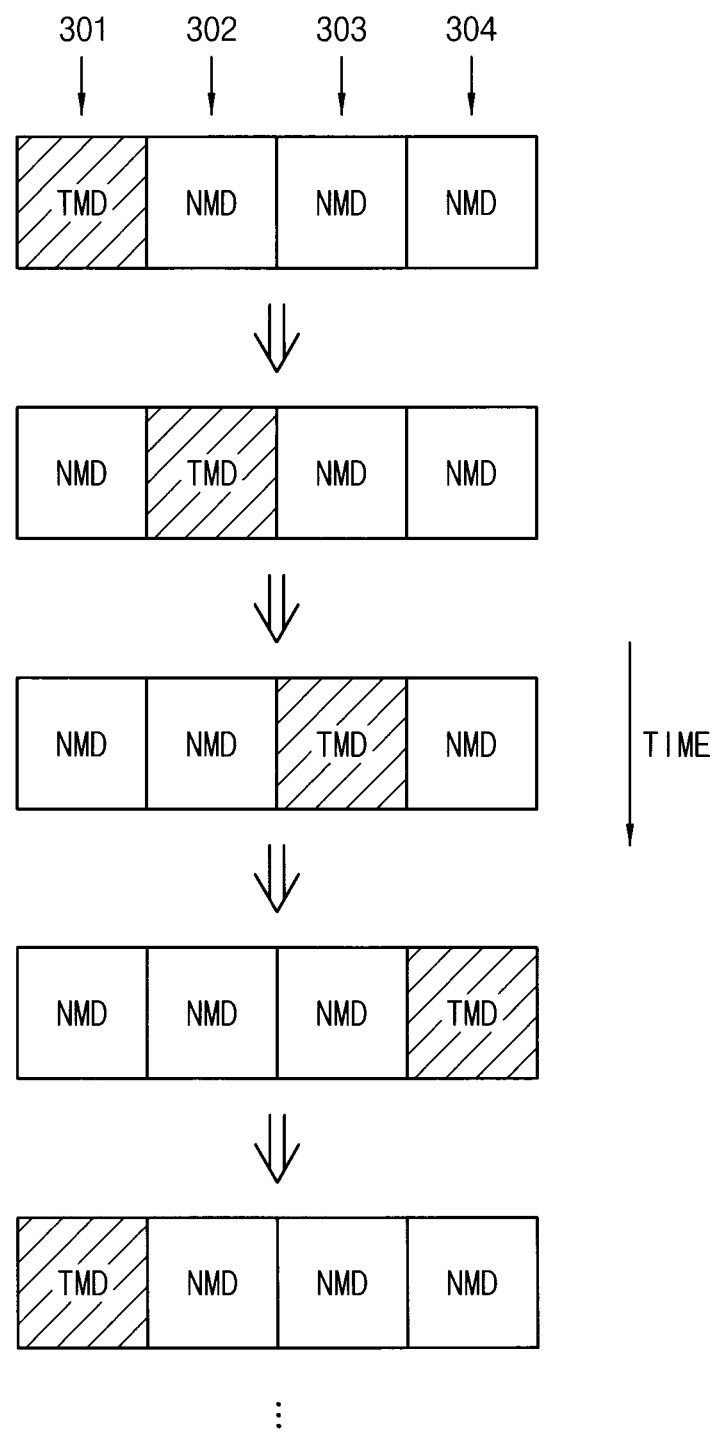

FIGS. 9 and 10 are diagrams illustrating setting a test object region for a method of controlling a volatile memory device according to example embodiments.

Referring to FIG. 9, a memory cell array 300 may be divided into a plurality of sub regions, for example, first through fourth sub regions 301~304, and one of the sub regions 301~304 may be set as the test object region. For example, the second sub region 302 may be set as the test object region as illustrated in FIG. 9. The memory controller may store the test address information TAI indicating the second sub region 302 corresponding to the test object region. While the second sub region 302 is designated for the test mode, the memory controller may block a normal access operation to the second sub region 302 (INACCESSABLE) and permit the normal access operation to the other sub regions 301, 303 and 304, based on the test address information TAI.

Referring to FIG. 10, the memory controller may set the plurality of sub regions 301~304 sequentially one by one as the test object region with respect to time. FIG. 10 illustrates that the plurality of sub regions 301~304 are set as the test object region in the test mode TMD with even frequency, but example embodiments are not limited thereto. For example, the particular sub region supposed to have higher probability of failure may be set as the test object region by a higher frequency than the other sub regions.

Figure 11:
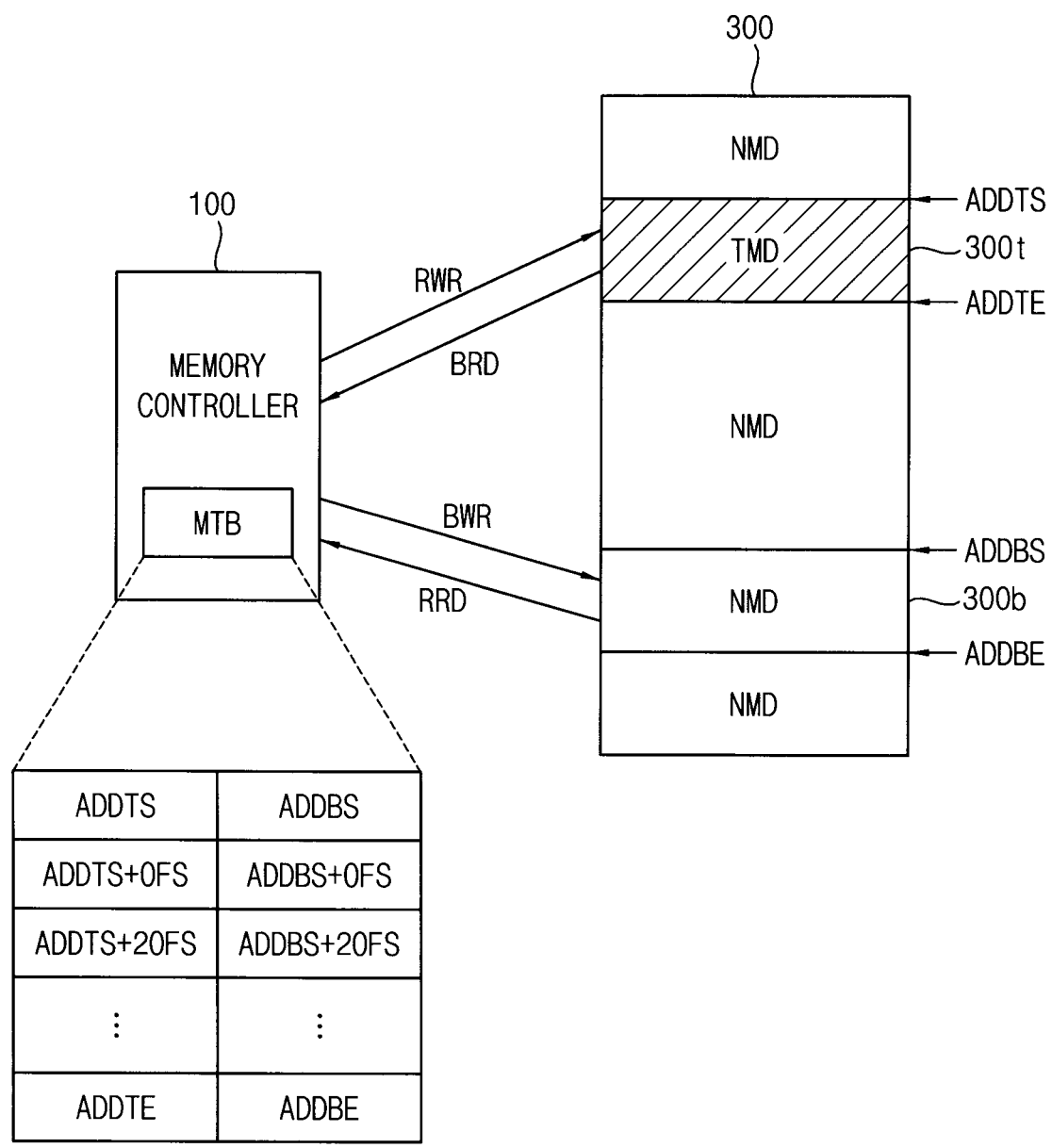
FIGS. 11 and 12 are diagrams illustrating a method of controlling repair of a volatile memory device according to example embodiments.
Figure 12:
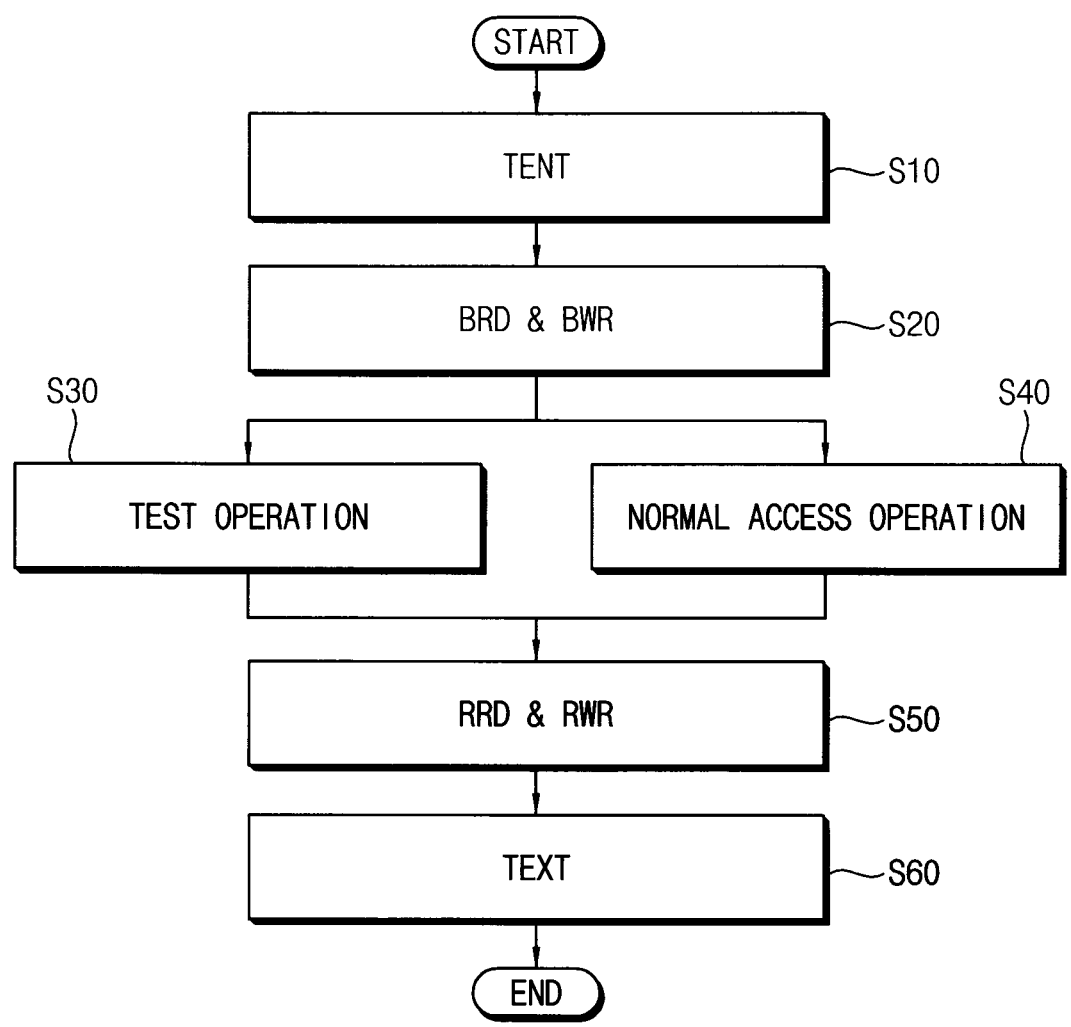

FIGS. 11 and 12 are diagrams illustrating a method of controlling repair of a volatile memory device according to example embodiments.

Referring to FIGS. 11 and 12, when a test object region 300t operating in the test mode TMD is set, data stored in the test object region 300t may be read to store the data in a backup region 300b of the memory cell array 300. When the test mode TMD with respect to the test object region 300t is completed, data stored in the backup region 300b may be read to store the data in the test object region 300t.

Referring to FIG. 12, the volatile memory device may start the test mode with respect to the test object region 300t based on the test enter command TENT provided from the memory controller 100 (S10). When the test mode is started, the memory controller 100 may perform a backup read operation BRD to read data stored in the test object region 300t and a backup write operation BWR to store the read data in the backup region 300b (S20). The volatile memory device may perform the test operation with respect to the test object region 300t based on the test operation condition such that an error probability is increased higher based on the test operation condition (S30) than the normal operation condition for the normal operation, as described above. The volatile memory device may perform the normal operation with respect to the other regions that are set in the normal mode NMD (S40).

When the data in the test object region 300t is backed up to the backup region 300b, the memory controller 100 may generate a mapping table MTB including mapping information about mapping relations between addresses of the test object region and addresses of the backup region. As illustrated in FIG. 11, the mapping table MTB includes addresses ADDTS, ADDTS+OFS, ADDTS+2OFS, . . . , and ADDTE of the test object region 300t and addresses ADDBS, ADDBS+OFS, ADDBS+2OFS, . . . , and ADDBE of the backup region 300b, which are one-to-one mapped.

While the test operation is performed with respect to the test object region 300t, the memory controller 100 may perform the normal access operation with respect to the backup region 300b instead of the test object region 300t based on the mapping table MTB.

When the test mode is completed, the memory controller 100 may perform a restore read operation RRD to read data stored in the backup region 300b and a restore write operation RWR to store the read data in the test object region 300t (S50). The volatile memory device may change to the normal mode based on the test exit command TEXT provided from the memory controller 100 (S60).

Figure 13:
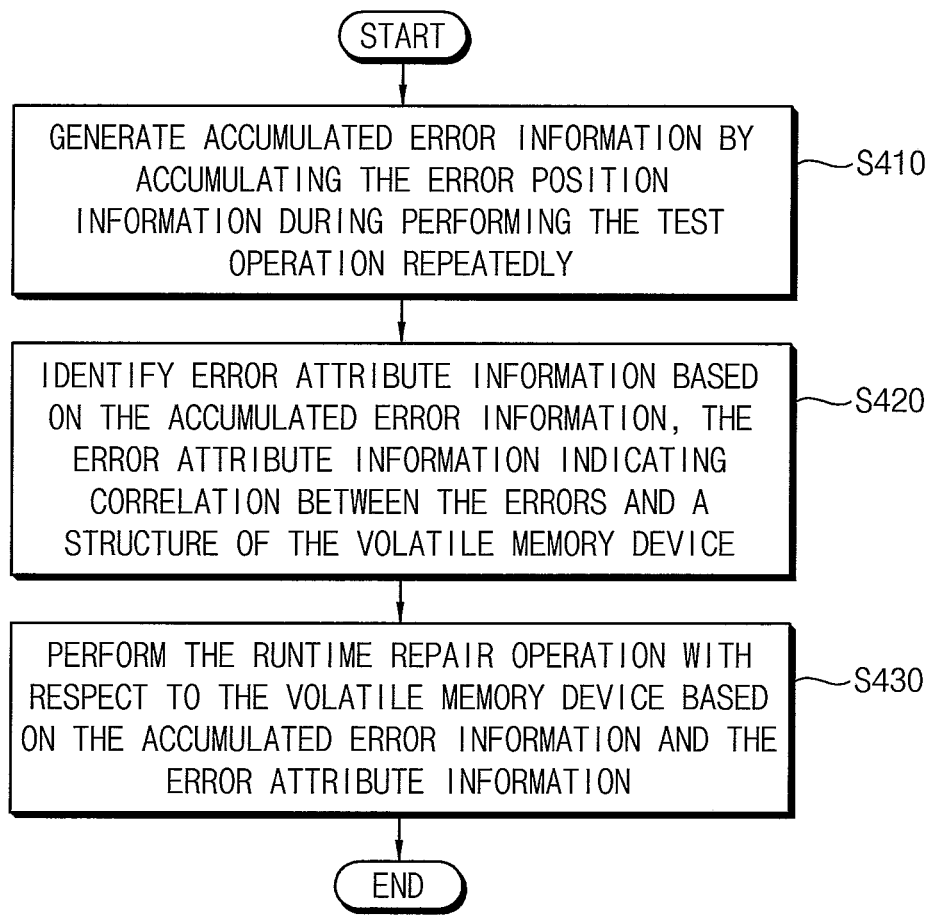
FIG. 13 is a flow chart illustrating a performance of a repair operation of a volatile memory device according to example embodiments.

FIG. 13 is a flow chart illustrating a performance of a repair operation of a volatile memory device according to example embodiments.

Referring to FIG. 13, accumulated error information may be generated by accumulating the error position information during performing the test operation repeatedly (S410). The accumulated error information may be information that reflects spatial and/or temporal history of the volatile memory device.

Figure 21:
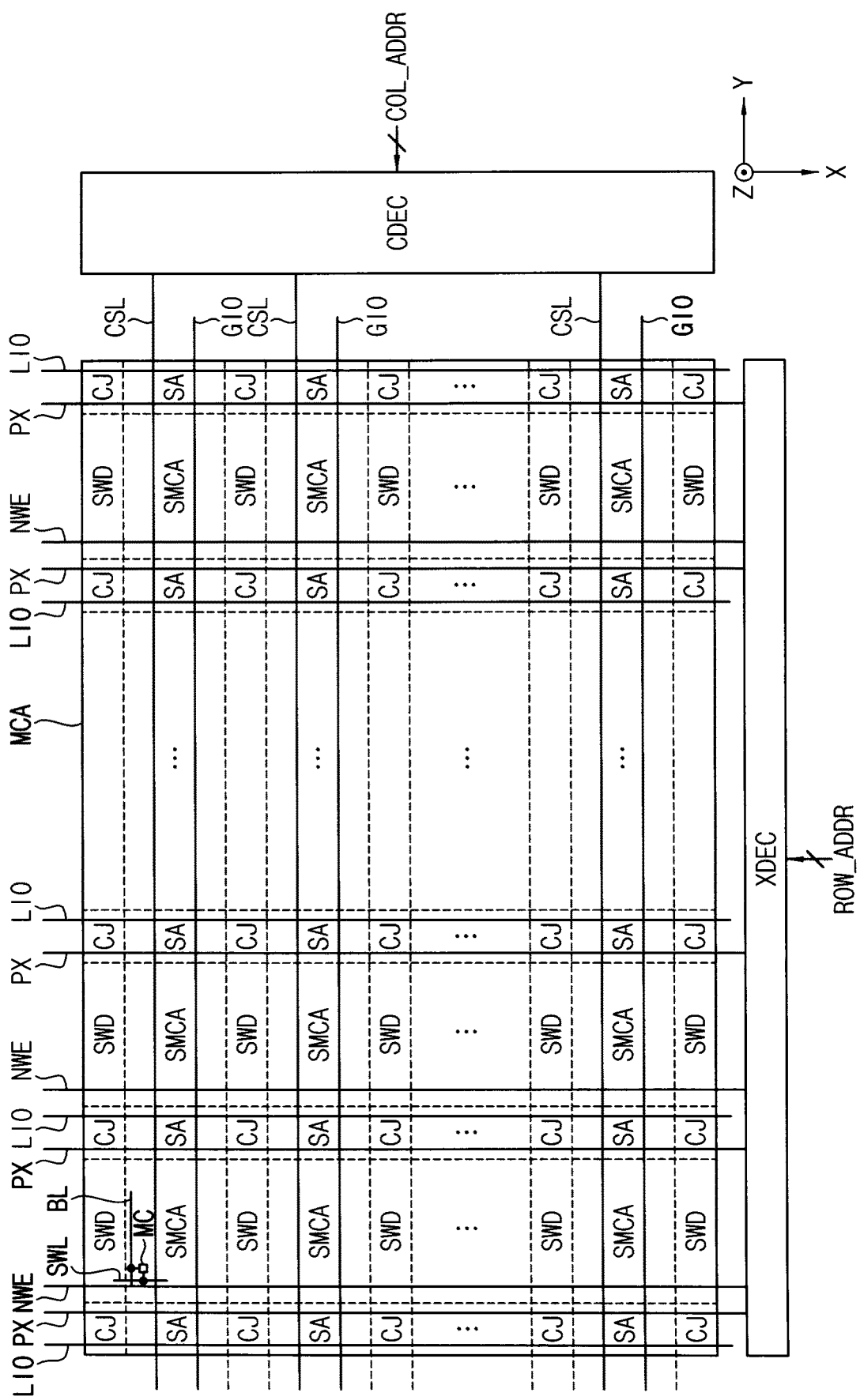
FIG. 21 is a diagram illustrating a layout of a memory cell array included in a volatile memory device according to example embodiments.

Error attribute information may be identified based on the accumulated error information, the error attribute information indicating correlation between the errors and a structure of the volatile memory device (S420). The accumulated error information may be stored and managed in an accumulated error table (e.g., shown in FIG. 15). The error attribute may be determined and assigned (or associated) based on distribution of the errors according to a structure of the volatile memory device. In some embodiments, the structure of the volatile memory device may include a wordline structure as shown in FIG. 21.

The runtime repair operation may be performed with respect to the volatile memory device based on the accumulated error information and the error attribute information (S430). The runtime repair operation indicates an operation to replace an address where the errors has occurred with a repair address, so that correctable errors occurred during normal operations of the volatile memory device may not be developed to uncorrectable errors to result in failure of the volatile memory device.

Figure 14A:
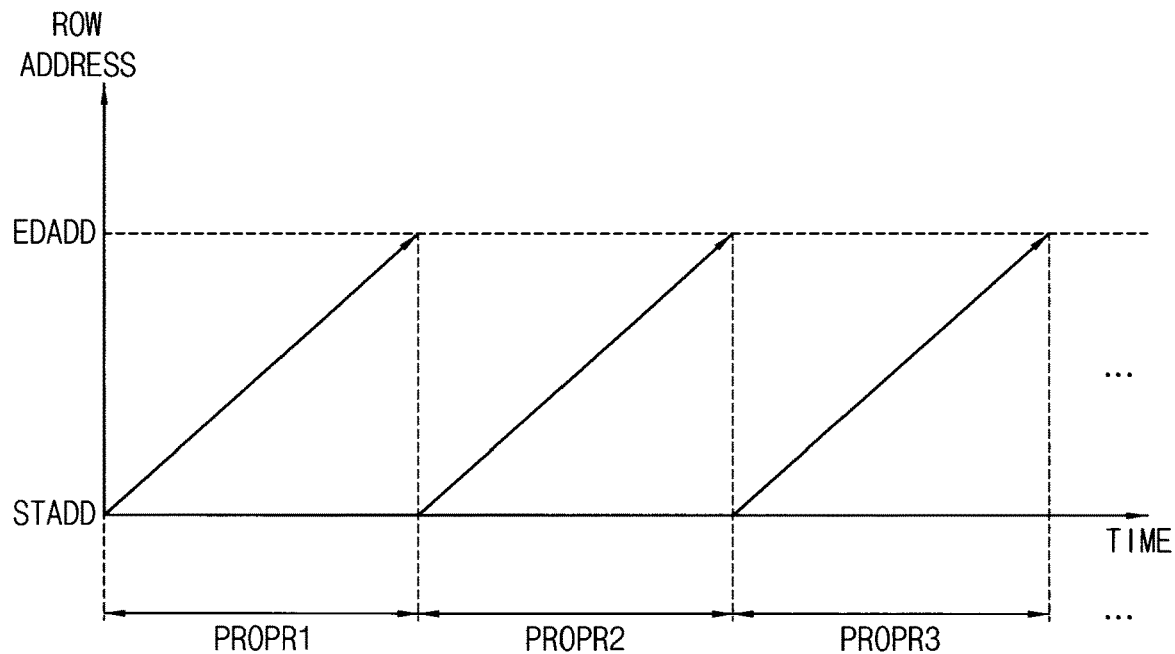
FIGS. 14A and 14B are diagrams illustrating a patrol read operation for a method of controlling repair of a volatile memory device according to example embodiments.
Figure 14B:
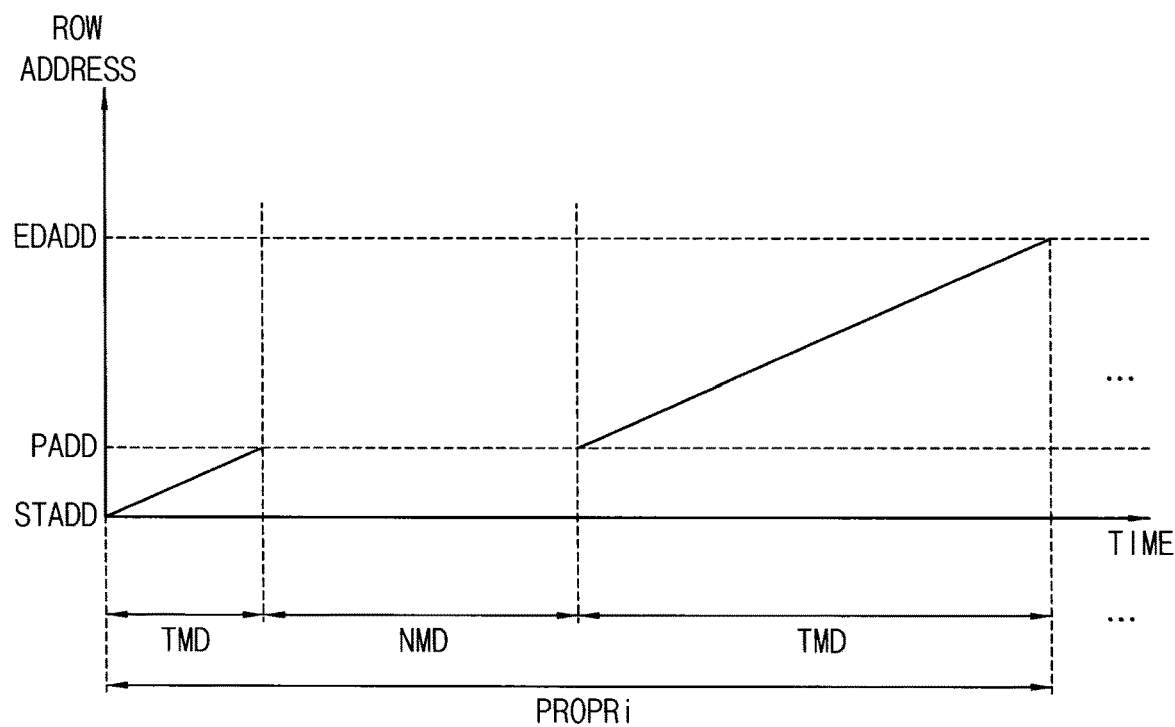

FIGS. 14A and 14B are diagrams illustrating a patrol read operation for a method of controlling repair of a volatile memory device according to example embodiments.

A patrol read operation may be performed regardless of an access read operation (or, a normal read operation) to provide data read from the volatile memory device to an external device. The patrol read operation may be performed repeatedly with respect to entire row addresses of the volatile memory device.

Referring to FIGS. 14A and 14B, a plurality of periods of patrol read operations PROPR1, PROPR2 and PROPR3 may be sequential. A patrol read operation may be performed during each period of the patrol read operations PROPR1, PROPR2 and PROPR3 For example, a patrol read operation may be performed from a start row address STADD to an end row address EDADD of entire row addresses of the volatile memory device during each period of patrol read operations PROPR1, PROPR2 and PROPR3. FIG. 14A illustrates a non-limiting example that the plurality of periods of patrol read operations PROPR1, PROPR2 and PROPR3 are performed in the same pattern. In some example embodiments, the repeated patrol read operations may be performed in different patterns.

FIG. 14B illustrates timings of the one patrol read operation PROPRi. The patrol read operation may be suspended while the access operation to the volatile memory device is performed (i.e., during the normal mode NMD), and the patrol read operation may be performed only during the test mode TMD. The pointer PADD indicating the address at which the patrol read operation is suspended may be stored in the repair manager RIVING. When the test mode TMD is resumed, the patrol read operation may be performed continuously based on the stored pointer PADD.

FIG. 15 is a diagram illustrating an accumulated error table for a method of controlling repair of a volatile memory device according to example embodiments.

An accumulated error table may be generated and managed with respect to each of a plurality of memory banks. FIG. 15 illustrates, as an example, three accumulated error tables AET1, AET2 and AET3 corresponding to three memory banks, including a detailed illustration of an example of the accumulated error information stored in the one accumulated error table AET1.

The repair manager RMNG may store, in the accumulated error table AET1, the accumulated error information such as candidate failed row addresses (PFRADD) and the number of correctable errors (EN), and error attributes (ATT). Among entire row addresses of the volatile memory device, the candidate failed row addresses RAa~RAf may have the number of correctable errors and the number of correctable errors 2, 1, 5, 4, 0 and 2 respectively corresponding to the candidate failed row addresses RAa~RAf. For example, FIG. 15 shows that the number of correctable errors of the candidate failed row address RAa is 2, the number of correctable errors of the candidate failed row address RAd is 4, and the like. For example, the number of correctable errors EN is the number of errors in the candidate failed row address that are correctable. The ATT indicates the above-described error attribute. N/A indicates that the error attribute is not determined and assigned to the corresponding candidate failed row address. In some embodiments, when the number of correctable errors is equal to or lower than 2, the ATT may be indicated as N/A. FIG. 15 shows an example that one error attribute ATT1 is assigned to (or associated with) the candidate failed row addresses RAc, RAd and RAe. In some embodiments, when the number of correctable errors is higher than 2, the ATT may be indicated as ATT1. The candidate failed row address RAe to which the error attribute is assigned may have the number of correctable errors of zero. For example, the row address may be included in the accumulated error table if the error attribute is assigned to the row address even though the row address has no error, which will be described below with reference to FIGS. 21 through 23.

Figure 16:
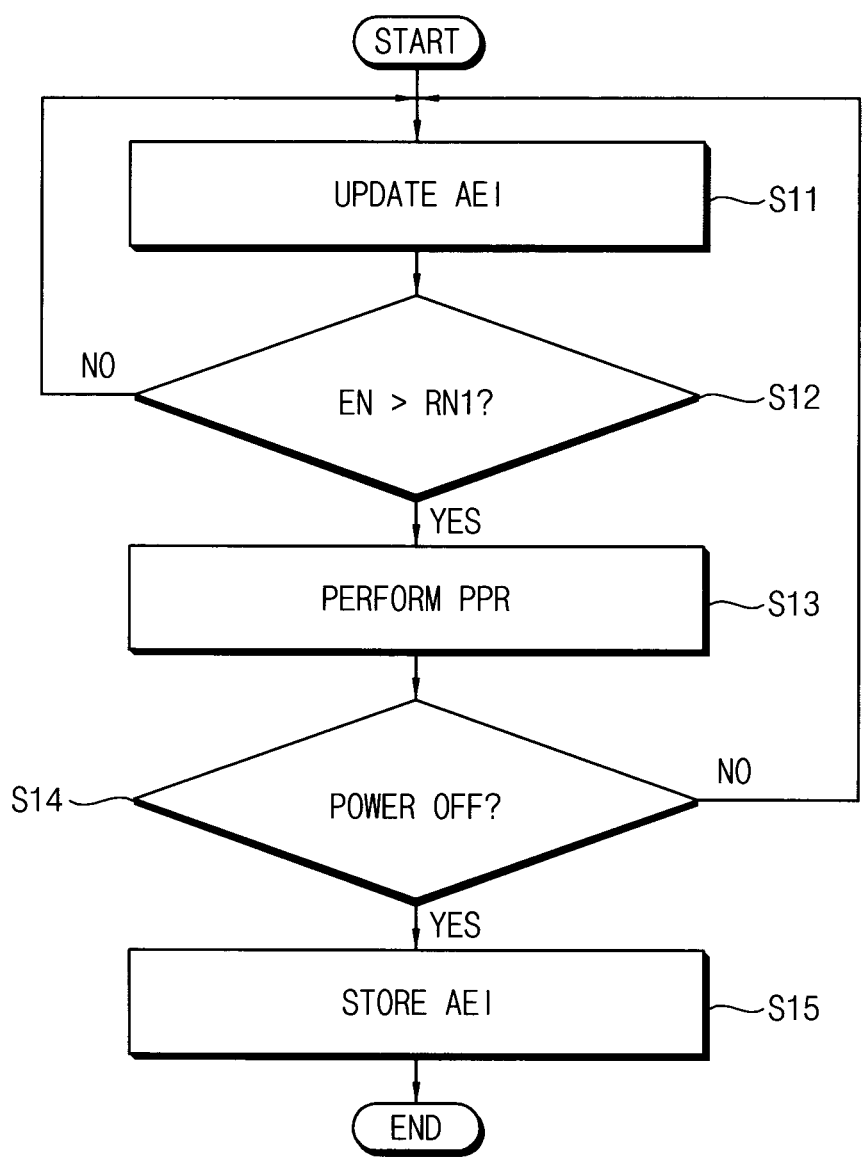
FIG. 16 is a flow chart illustrating a method of controlling repair of a volatile memory device according to example embodiments.

FIG. 16 is a flow chart illustrating a method of controlling repair of a volatile memory device according to example embodiments.

Referring to FIG. 16, the accumulated error information AEI may be updated (S11) whenever the patrol read operation is performed once. It is determined whether the number of correctable errors EN is greater than a reference number RN1 with respect to each of the candidate failed row addresses included in the accumulated error information AEI (S12), When the number of correctable errors EN of at least one of the candidate failed row addresses is greater than the reference number RN1 (S12:YES), the post package repair (PPR) operation is performed (S13) with respect to all of the candidate failed row addresses corresponding to the number of correctable errors EN greater than the reference number RN1. When the number of correctable errors EN of all the candidate failed row addresses is not greater than the reference number RN1 (S12:NO), the patrol read operation is performed again to update the accumulated error information AEI and it is determined again whether the post package repair operation is required based on the updated accumulated error information AEI. In some embodiments, before the PPR operation is performed, the repair manager RMNG may determine the error attribute ATT based on the accumulated error information AEI so that the PPR operation may be performed based on the accumulated error information AEI and the error attribute ATT.

Such a sequence of the operations may be repeated until the volatile memory device is powered off (S14:NO). The accumulated error information AEI and the error attribute may be stored in a nonvolatile memory device (S15) when the volatile memory device is powered off. The accumulated error information AEI and the error attribute ATT may be loaded from the nonvolatile memory device to the volatile memory device when the volatile memory device is powered on again so that the method of controlling repair of a volatile memory device according to example embodiments may be performed continuously even though the volatile memory device is powered off.

Figure 17:
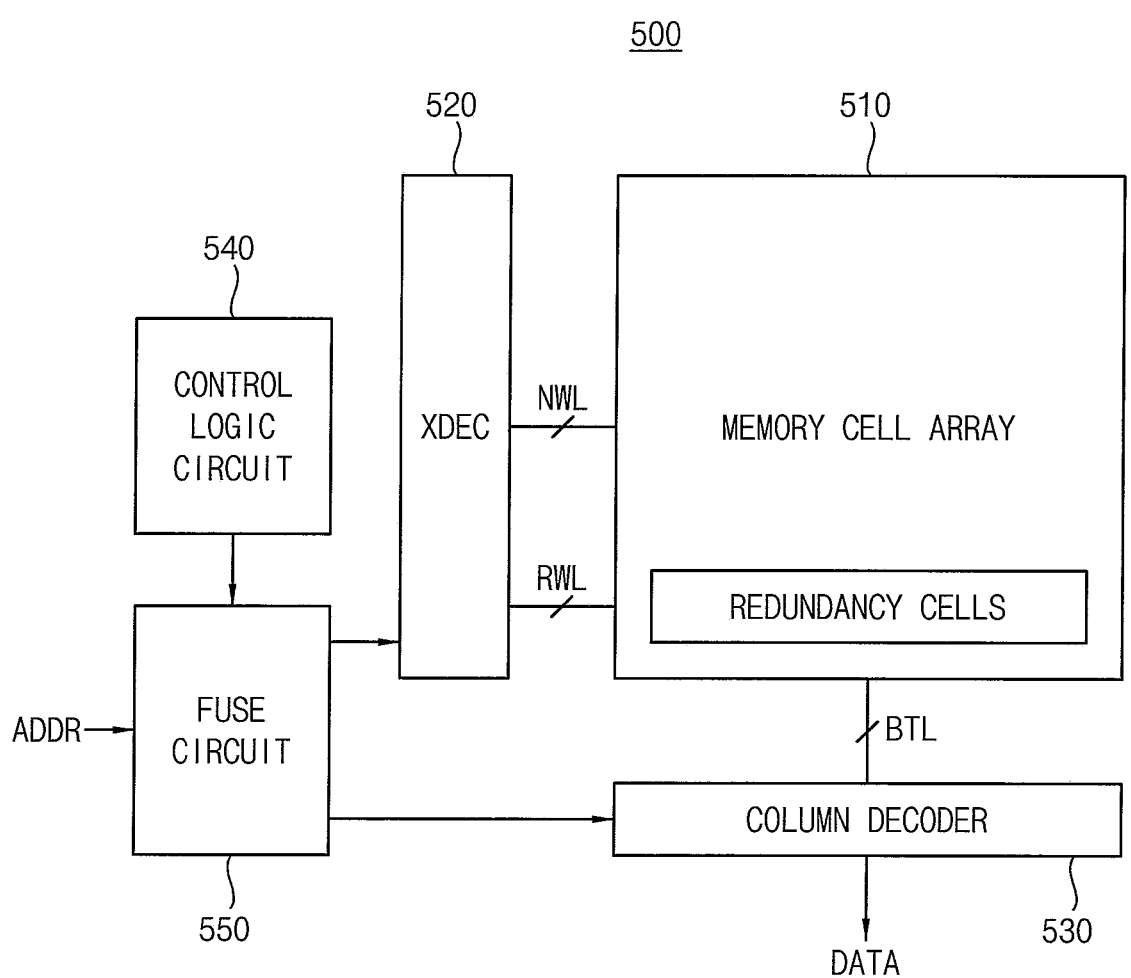
FIG. 17 is a block diagram illustrating a volatile memory device performing a post package repair operation according to example embodiments.

FIG. 17 is a block diagram illustrating a volatile memory device performing a post package repair operation according to example embodiments.

Referring to FIG. 17, a DRAM device 500 may include a memory cell array 510, a row decoder (XDEC) 520, a column decoder (CDEC) 530, a control logic circuit 540 and a fuse circuit 550.

The memory cell array 510 may include a plurality of DRAM cells. The DRAM cells may be connected to wordlines NWL and RWL and bit lines BTL, respectively. A portion of the DRAM cells may be normal cells and another portion of the DRAM cells may be redundancy cells for replacing the failed cells among the normal cells. The wordlines NWL may be normal word lines connected to the normal cells and the wordlines RWL may be redundancy word lines connected to the redundancy cells.

The row decoder 520 may be connected to the memory cell array 510 through the wordlines NWL and RWL. The row decoder 520 may select one of the wordlines based on an address ADDR (that is, a row address in the address ADDR), and control a voltage of the selected wordline. The column decoder 530 may be connected to the memory cell array 510 through the bitlines BTL. The column decoder 530 may select a portion of the bitlines based on the address ADDR (that is, a column address in the address ADDR), and control or detect voltages of the selected bitlines.

The control logic circuit 540 may control an overall operation of the DRAM device 500. A fuse setting operation may be performed under control of the control logic circuit 540. The control logic circuit 540 may be configured to set the fuse-setting of the fuse circuit 550 by the runtime repair operation. The normal cells may be replaced with the redundancy cells through the fuse-setting of the fuse circuit 550. For example, the fuse circuit 550 may receive the address ADDR from the memory controller. When the row address in the address ADDR corresponds to the normal wordline NWL that is determined as the failed wordline, the fuse circuit 550 may output a repair address so that the row decoder 520 may select the redundancy wordline RWL instead of the normal wordline NWL.

For example, the fuse circuit 550 may determine the fuse-setting so that the row address corresponding to the failed address may be converted to the repair address. The row decoder 520 may select the redundancy wordline RWL based on the repair address from the fuse circuit 550. The fuse circuit 550 may transfer the row address that does not correspond to the failed address to the row decoder 520 without conversion.

As such, the DRAM device 500 may perform the post package repair operation with respect to the failed address through the electrical fuse-setting of the fuse circuit 550.

Figure 18:
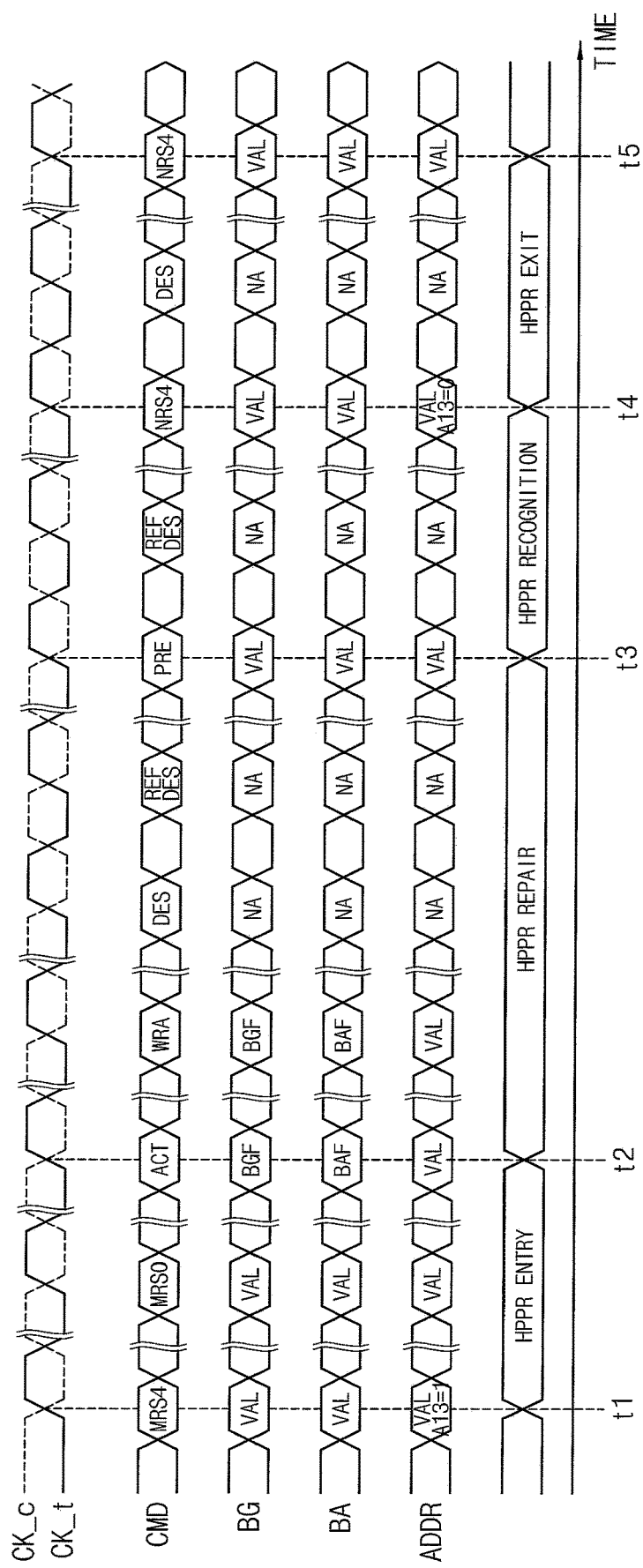
FIG. 18 is a timing diagram illustrating signals for the post package repair operation.

FIG. 18 is a timing diagram illustrating signals for the post package repair operation.

For example, the runtime repair operation may be performed based on a hard post package repair (hPPR). In response to signals in a timing diagram of FIG. 18, the electrical fuse-setting of the fuse circuit 550 in FIG. 17 may be performed.

Referring to FIG. 18, during time point t1 through time point t2, the DRAM device may enter an hPPR mode in response to mode register set commands MRS4 and MRS0, and addresses (bank group address BG, bank address in bank group BA, and ADDR) provided from the memory controller. For example, the value of the address bit A13 may be set to "1" indicating the activation of the hPPR operation. In some example embodiments, before entering the hPPR mode, data stored in a memory bank including the failed row may be flushed to a nonvolatile memory device. In addition, before entering the hPPR mode, all memory banks of the DRAM device may be precharged. For example, bit lines of all memory banks are precharged before entering the hPPR mode.

During time point t2 through time point t3, the DRAM device may perform the hPPR operation in response to an active command ACT, an automatic precharge write command WRA and address signals BGF and BAF. For example, the address signals BGF and BAF may correspond to the failed rows. The hPPR operation may be performed through the electrical fuse-setting of the fuse circuit 550 as described with reference to FIG. 17.

During time point t3 through time point t4, the DRAM device may perform an hPPR recognition in response to a precharge command PRE, and during time point t4 through time point t5, The DRAM device may exit from the hPPR mode in response to the mode register set command MRS4 and the value "0" of the address bit A13. After exiting the hPPR mode, the DRAM device may restore the data based on the flushed data in the nonvolatile memory device.

FIG. 18 illustrates a non-limiting example of a direct repair, and example embodiments are not limited thereto. In some example embodiments, the hPPR operation may be performed using a normal write command WR instead of the automatic precharge write command WRA. In this case, backup or flushing of the data stored in all memory banks of the DRAM device may be performed before entering the hPPR mode. Alternatively, the direct repair may be performed based on a soft post package repair (sPPR).

Figure 19:
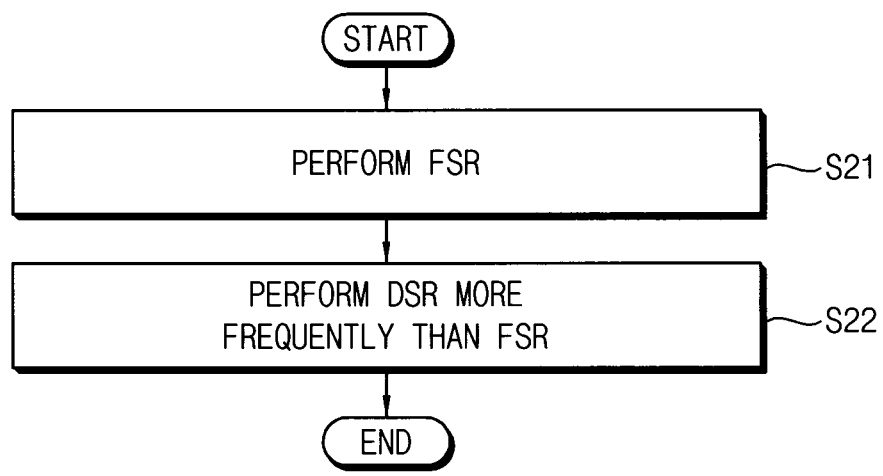
FIGS. 19 and 20 are diagrams illustrating a patrol read operation for a method of controlling repair of a volatile memory device according to example embodiments.
Figure 20:
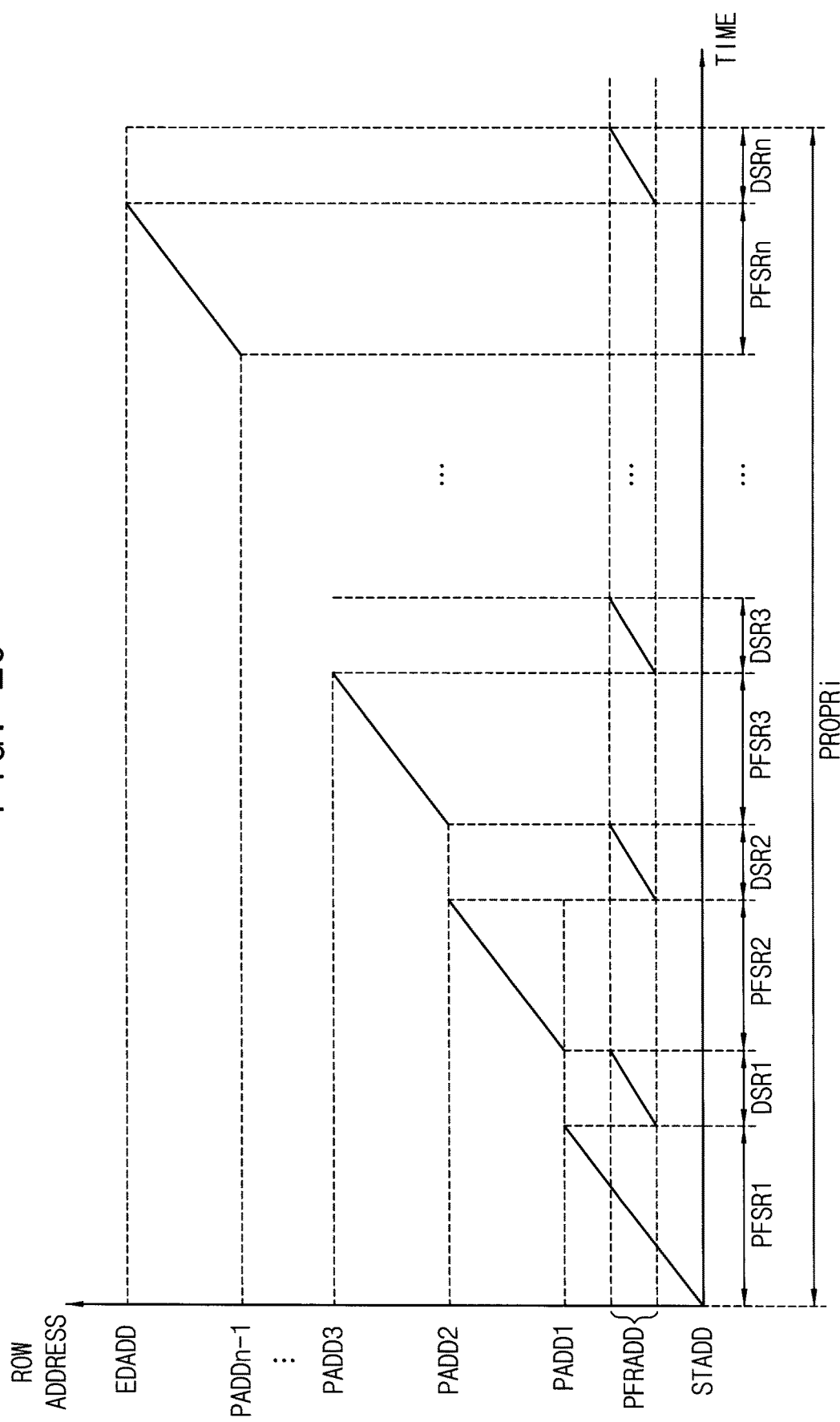

FIGS. 19 and 20 are diagrams illustrating a patrol read operation for a method of controlling repair of a volatile memory device according to example embodiments.

Referring to FIG. 19, a full scanning read operation FSR may be performed sequentially with respect to the entire row addresses of the volatile memory device (S21). Also a deep scanning read operation DSR may be performed sequentially with respect to the candidate failed row addresses included in the accumulated error table more frequently than the full scanning read operation FSR. For example, the deep scanning read operation DSR is performed two or more times while the full scanning read operation FSR is performed once. As such, monitoring through the patrol read operation may be enforced with respect to the candidate failed row addresses that have the errors or higher probability of future errors, and the failure of the volatile memory device may be further prevented.

FIG. 20 illustrates, as an example, one patrol read operation PROPRi including one full scanning read operation FSR and a plurality of deep scanning read operations DSR1~DSRn. The one full scanning read operation FSR may be divided into a plurality of part scanning read operations PFSR1~PFSRn. Each of the deep scanning read operations DSR1~DSRn may start whenever the full scanning read operation arrives at an intermediate row address among row addresses PADD1~PADDn−1. According to an example embodiment, FIG. 20 illustrates that the candidate failed row addresses PFRADD for the deep scanning read operation are adjacent to each other for convenience of illustration, the candidate failed row addresses PFRADD may be distributed irregularly over the entire row addresses between the start row address STADD to the end row address EDADD.

For example, the deep scanning read operation corresponding to the candidate failed row addresses PFRADD may be performed multiple times (n+1) while the full scanning read operation is performed once with respect to the other row addresses except for the candidate failed row addresses PFRADD.

FIG. 21 is a diagram illustrating a layout of a memory cell array included in a volatile memory device according to example embodiments.

FIG. 21 illustrates a memory cell array region MCA, a column decoder CDEC, and a row decoder XDEC and other components of the volatile memory device are omitted for convenience of illustration. The memory cell array region MCA includes a dual wordline structure including a main wordline NWE and a plurality of sub wordlines SWL, conjunction regions CJ, sub wordline driver regions SWD, sense amplifier regions SA and sub memory cell array regions SMCA.

In some example embodiments, word selection signal lines PX, main wordlines NEW, sub wordlines SWL, column selection signal lines CSL, local input-output data lines LIO and global input-output data lines GIO may be formed in a vertically upper portion of the memory cell array region MCA. The power lines are omitted in FIG. 21 for convenience of illustration.

In the memory cell array region MCA, the conjunction regions CJ, the sub wordline driver regions SWD, the sense amplifier regions SA and the sub memory cell array regions SMCA are disposed repeatedly in a row direction X and a column direction Y. The memory cells MC are formed in the sub memory cell array regions SMCA and connected to the sub wordlines SWL and the bitlines BL. The data may be written to or read from the memory cells MC in response to the signals transferred through the word selection signal lines PX, the main wordlines NWE and the column selection signal lines CSL.

The column decoder CDEC generates signals on column select signal lines CSL to select one or more columns of the array for reading or writing according to a supplied column address COL_ADDR. The row decoder XDEC decodes the row address ROW_ADDR to generate signals for selecting one of the main wordlines NWE and signals for selecting one of the word line selection lines PX.

The main wordlines NWE extend in the row direction X on the sub wordline driver regions SWD and the sub memory cell array regions SMCA, and the word selection signal lines PX and the local input-output data lines LIO extend in the row direction X on the conjunction regions CJ and the sense amplifier regions SA. The column selection signal lines CSL and the global input-output data lines GIO extend in the column direction Y on the sense amplifier regions SA and the sub memory cell array regions SMCA.

Figure 22:
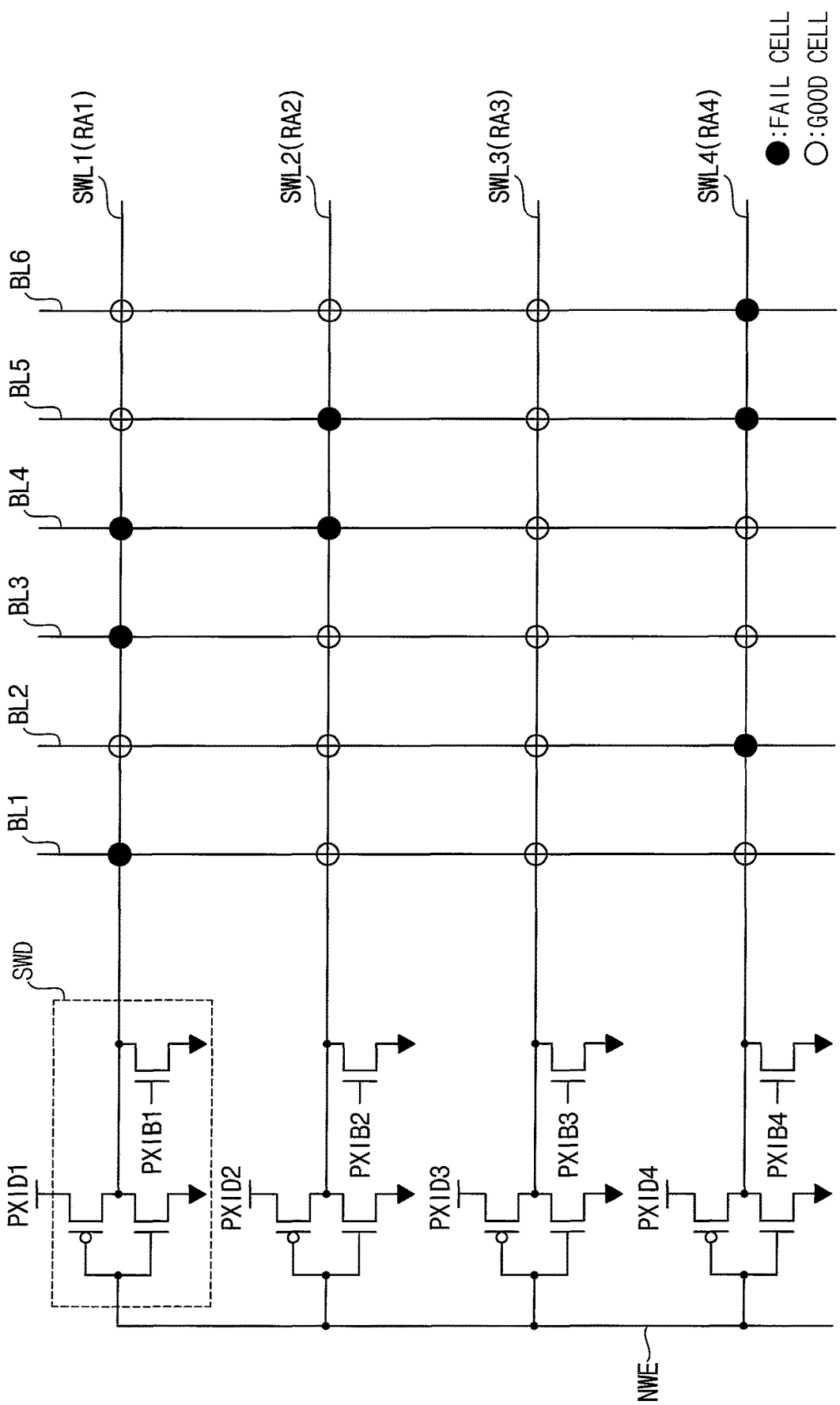

FIGS. 22 and 23 are diagrams illustrating a determination of error attribute for a method of controlling repair of a volatile memory device according to example embodiments.

FIG. 22 illustrates an example that a plurality of sub wordlines SWL1~SWL4 are connected to one main wordline NWE through sub wordline drivers SWD. Signals PXID1~PXID4 and PXIB1~PXIB4 are generated by address decoding. As described above, each of the signals PXID1~PXID4 may be one of the test selected wordline voltage PXID' for the test operation and the normal selected wordline voltage PXID for the normal operation.

The sub wordlines SWL1~SWL4 connected to the same main wordline NWE have a structural correlation. For example, when a fault is occurred in the main wordline NWE or in a driver that drives the main wordline NWE, the number of the sub wordlines having the errors or the sum of errors in the sub wordlines SWL1~SWL4 may be increased. In the example case illustrated in FIGS. 22 and 23, the number of errors of the sub wordline SWL3 is zero, but the sub wordline SWL3 may be rapidly susceptible to the failure. To prevent such possibility of the failure, the error attribute may be assigned to an address group including the row addresses RA1~RA4 corresponding to all of the sub wordlines SWL1~SWL4 connected to the same main wordline NWE, and the address group RA1~RA4 may be stored in the accumulated error table as the candidate failed row addresses.

In some example embodiments, the post package repair operation may be performed with respect to all of the row addresses RA1~RA4 included in the address group when a sum of the number of correctable errors of the address group is greater than a number of risk errors that is greater than a first reference number. For example, the post package repair operation may be performed with respect to the row address RA3 even having no error. In some embodiments, the first reference number may be stored in a register.

In FIG. 23, AETb indicates the accumulated error table before determining the error attribute ATT1, and AETa indicates the accumulated error table after determining the error attribute ATT1. Accordingly, according to an embodiment, the accumulated error table may be generated or modified based on the error attribute determination.

In some example embodiments, main address error attribute may be determined with respect to the address group including row addresses of a plurality of sub wordlines corresponding to a main wordline of the volatile memory device when the number of the candidate failed row addresses included in the address group is greater than a second reference number. In the example of FIGS. 22 and 23, the number of the candidate failed row addresses corresponds to three and the second reference number is assumed to be two. In some embodiments, the second reference number may be stored in a register.

In other example embodiments, the main address error attribute may be determined with respect to the address group including row addresses of a plurality of sub wordlines corresponding to a main wordline of the volatile memory device when a sum of the number of correctable errors corresponding to all of the row addresses included in the address group is greater than a third reference number. In the example of FIGS. 22 and 23, the sum of the number of correctable errors corresponds to eight and the third reference number is assumed to be seven. In some embodiments, the third reference number may be stored in a register.

FIG. 24 is a block diagram illustrating a storage device according to example embodiments.

Referring to FIG. 24, a system 1000 includes a host device 2000 and a storage device 3000. For example, the host device 2000 may be an embedded multimedia card (eMMC).

The host device 2000 may be configured to control data processing operations, such as data read operations and data write operations. The data processing operations may be performed at a single data rate (SDR) or a double data rate (DDR).

The host device 2000 may be a data processing device, such as a central processing unit (CPU), a processor, a microprocessor, or an application processor, which can process data. The host device 2000 and the storage device 3000 may be embedded or implemented in an electronic device. The system 1000 of FIG. 24 may be an arbitrary electronic device.

The storage device 3000 may be electrically connected with other components of the system 1000 (electronic device) through connection means (e.g., pads, pins, buses, or communication lines) to communicate with the host device 2000. The host device 2000 may include a processor (CPU) 2100, memory (MEM) 2200 and a host controller interface (HCI) 2300 connected through a bus 1320. Operating system (OS) and/or host firmware (FW) 2110 may be driven by the processor 2100. The processor 2100 may include hardware and/or software for controlling generation of a command CMD, analysis of a response RES, storing of data in a register, e.g., an extended (EXT) CSD register (not shown), of the storage device 3000, and/or data processing. The processor 2100 may drive the operation system and the host firmware 2110 to perform these operations. The host controller interface 2300 may interface with the storage device 3000.

The storage device 3000 may include multiple nonvolatile memory devices (NVM) 3100 and a storage controller 3200. In some embodiments, the storage controller 3200 may be a memory controller. The nonvolatile memory devices 3100 may be optionally supplied with an external high voltage VPP. The nonvolatile memory devices 3100 may be implemented with flash memory, FRAM, PRAM, MRAM, etc.

The storage controller 3200 may be connected to the nonvolatile memory devices 3100 through multiple channels CH1 to CHi. The storage controller 3200 may include one or more processors 3210, an ECC block 3220, a host interface 3230, a volatile memory device 3240, a nonvolatile memory interface 3250 and a task queue 3260. In some example embodiments, the non-volatile memory devices 3100 may include on-chip ECC engines (not shown), and in this case the ECC block 3220 may be omitted.

The volatile memory device 3240 may store data used to drive the storage controller 3200. Although FIG. 24 illustrates an example embodiment where the volatile memory device 3240 is included in the storage controller 3200, the volatile memory device 3240 is not limited thereto. For example, the volatile memory device 3240 may be placed outside the storage controller 3200. The volatile memory device 3240 may be implemented as one of the volatile memory devices 200, 200a, and 500 disclosed herein.

The ECC block 3220 may calculate error correction code values of data to be programmed at a writing operation, and may correct an error of read data using an error correction code value at a read operation.

The processor 3210 is configured to control overall operations of the storage controller 3200. For example, the processor 3210 may operate firmware 212 including a flash translation layer (FTL), etc. The FTL may perform various functions, e.g., address mapping, read calibration, error correction, etc.

The processor 3210 may have a function to control the volatile memory device 3240. In this case, the above-described repair manager 3211 and the accumulated error table AET may be implemented in the processor 3210. The repair manager 3211 may be implemented as hardware, software or a combination of hardware and software in the processor 3210.

The task queue 3260 may store tasks (e.g., write tasks and read tasks provided from the host device 2000) and status information of the respective tasks. The host interface 3230 may provide an interface with external devices such as the host device 2000. The nonvolatile memory interface 3250 may provide an interface with the nonvolatile memory devices 3100. The host device 2000 and the storage device 3000 may be connected through a bus 1310.

Figure 25:
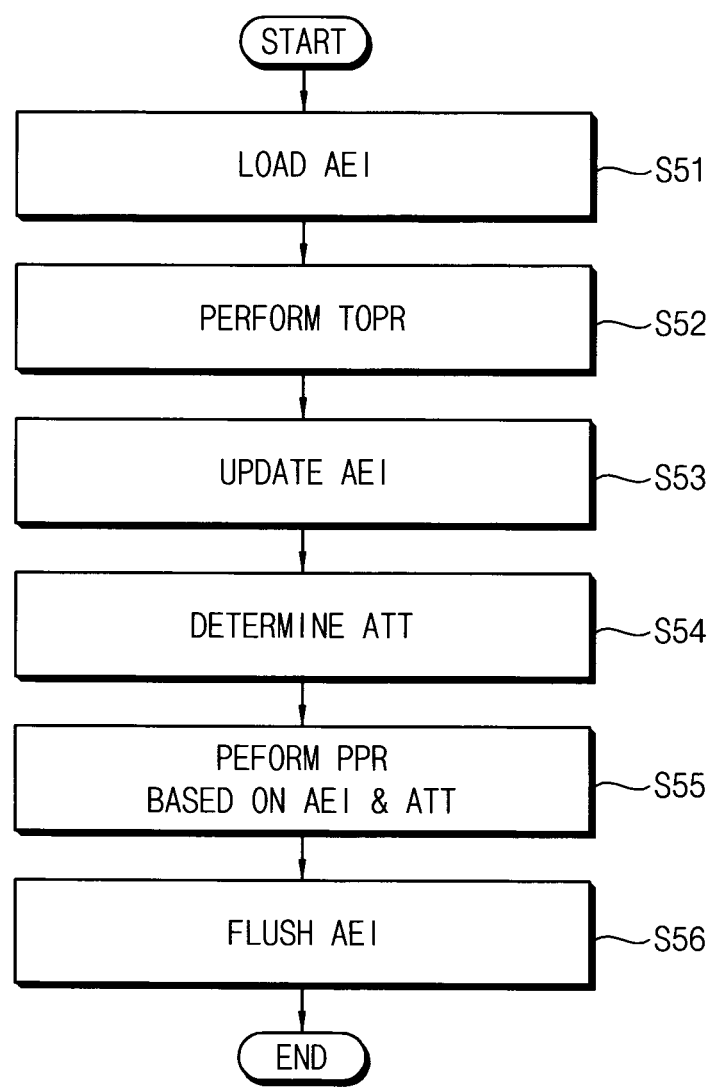
FIG. 25 is a flow chart illustrating a method of controlling repair of a volatile memory device included in a storage device according to example embodiments.

FIG. 25 is a flow chart illustrating a method of controlling repair of a volatile memory device included in a storage device according to example embodiments.

Referring to FIGS. 24 and 25, the processor 3210 may load repair information including the accumulated information AEI from the nonvolatile memory device 3100 (S51) and store the accumulated error information AEI in the accumulated error table AET. As described above, the repair manager 3211 may repeatedly perform test operation TOPR (e.g., the patrol read operation) (S52) based on the test operation condition by the failure acceleration scheme to update the accumulated error information AEI (S53). The repair manager 1311 may determine the error attribute ATT based on the accumulated error information AEI (S54) and perform the runtime repair operation, e.g., the post package repair operation based on the accumulated error information AEI and the error attribute ATT (S55). When the storage device 3000 is powered off, the accumulated error information AEI may be backed up or flushed into the nonvolatile memory devices 3100 (S56). The backup of the accumulated error table may be performed periodically even though the storage device 3000 is not powered off.

The inventive concept may be applied to any volatile memory device requiring repair and systems including the volatile memory device. For example, the inventive concept may be applied to systems such as a memory card, a solid state drive (SSD), an embedded multimedia card (eMMC), a universal flash storage (UFS), a mobile phone, a smart phone, a personal digital assistant (PDA), a portable multimedia player (PMP), a digital camera, a camcorder, a personal computer (PC), a server computer, a workstation, a laptop computer, a digital TV, a set-top box, a portable game console, a navigation system, a wearable device, an internet of things (IoT) device, an internet of everything (IoE) device, an e-book, a virtual reality (VR) device, an augmented reality (AR) device, etc.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A method of controlling repair of a volatile memory device including a memory cell array, the method comprising:
   setting a test operation condition of the volatile memory device for a test operation such that an error probability is increased based on the test operation condition, compared to a normal operation condition for a normal operation of the volatile memory device, the test operation condition and the test operation being set based on a manufacturer, and the normal operation condition and the normal operation being set based on a standard specification;
   setting a test mode with respect to a test object region corresponding to at least a portion of the memory cell array;
   setting a normal mode with respect to a normal region of the memory cell array other than the test object region;
   performing the test operation of the volatile memory device on the test object region based on the test operation condition during the test mode to detect error position information of errors in data stored in the test object region;
   performing the normal operation of the volatile memory device on the normal region based on the normal operation condition during the normal mode; and
   performing a runtime repair operation with respect to the volatile memory device based on the error position information.

2. The method of claim 1, wherein the setting of the test operation condition includes:
   setting a refresh interval time that is longer than a corresponding refresh interval time for the normal operation of the volatile memory device.

3. The method of claim 1, wherein the setting of the test operation condition includes:
   setting a selected wordline voltage that is lower than a corresponding selected wordline voltage for the normal operation of the volatile memory device.

4. The method of claim 1, wherein the setting of the test operation condition includes:
   setting a value of a timing parameter that is smaller than a value of a corresponding timing parameter for the normal operation of the volatile memory device.

5. The method of claim 1, wherein the setting of the test mode includes:
   blocking the normal operation for the test object region.

6. The method of claim 1, further comprising:
   reading data stored in the test object region to store the data in a backup region of the memory cell array;
   generating a mapping table including mapping information about mapping relations between addresses of the test object region and addresses of the backup region; and
   while the test operation is performed with respect to the test object region, performing the normal operation with respect to the backup region instead of the test object region based on the mapping table.

7. The method of claim 6, further comprising:
   when the test operation with respect to the test object region is completed, reading data stored in the backup region to store the data in the test object region.

8. The method of claim 1, wherein the setting of the test mode includes:
   dividing the memory cell array into a plurality of sub regions; and
   setting one of the plurality of sub regions as the test object region.

9. The method of claim 8, wherein the plurality of sub regions are set sequentially one by one as the test object region with respect to time.

10. The method of claim 1, wherein the setting of the test mode includes:
    starting the test mode based on a test enter command provided from a memory controller outside the volatile memory device; and
    completing the test mode based on a test exit command provided from the memory controller.

11. The method of claim 10, wherein the test enter command includes a test address information indicating the test object region.

12. The method of claim 1, wherein the performing of the runtime repair operation includes:
    generating accumulated error information by accumulating the error position information during performing the test operation repeatedly;
    identifying error attribute information based on the accumulated error information, the error attribute information indicating correlation between the errors and a structure of the volatile memory device; and
    performing the runtime repair operation with respect to the volatile memory device based on the accumulated error information and the error attribute information, wherein the accumulated error information includes candidate failed row addresses among entire row addresses of the volatile memory device and the number of correctable errors corresponding to the respective candidate failed row addresses.

13. The method of claim 12, wherein the generating of the accumulated error information includes:
storing the candidate failed row addresses in an accumulated error table.

14. The method of claim 13, wherein the performing of the runtime repair operation includes:
performing a post package repair operation with respect to a first candidate failed row address among the candidate fail row addresses, wherein the number of correctable errors for the first candidate failed row address is greater than a stored reference number.

15. The method of claim 13, wherein the performing of the test operation includes:
during a period of time, performing a full scanning read operation sequentially with respect to the entire row addresses of the volatile memory device; and
during the period of time, performing a deep scanning read operation sequentially with respect to the candidate failed row addresses, and
wherein the deep scanning read operation is performed two or more times while the full scanning read operation is performed once.

16. The method of claim 13, wherein the generating of the accumulated error information further includes:
in the accumulated error table, storing an address group including row addresses each having the same error attribute information.

17. The method of claim 16, wherein the performing of the runtime repair operation includes:
when a sum of the number of correctable errors of the address group is greater than a reference number, performing a post package repair operation with respect to all of row addresses included in the address group.

18. The method of claim 12, further comprising:
when the volatile memory device is powered off, storing the accumulated error information and the error attribute information in a nonvolatile memory device; and
loading the accumulated error information and the error attribute information from the nonvolatile memory device to the volatile memory device when the volatile memory device is powered on.

19. A method of controlling repair of a volatile memory device included in a storage device, the method comprising:
setting a test operation condition of the volatile memory device for a test operation such that an error probability is increased based on the test operation condition, compared to a normal operation condition for a normal operation of the volatile memory device, the test operation condition and the test operation being set based on a manufacturer, and the normal operation condition and the normal operation being set based on a standard specification;
setting a test mode with respect to a test object region corresponding to at least a portion of a memory cell array included in the volatile memory device;
setting a normal mode with respect to a normal region of the memory cell array other than the test object region;
performing the test operation of the volatile memory device on the test object region based on the test operation condition during the test mode to detect error position information of errors in data stored in the test object region;
performing the normal operation of the volatile memory device on the normal region based on the normal operation condition during the normal mode;
generating accumulated error information by accumulating the error position information during performing the test operation repeatedly;
identifying error attribute information based on the accumulated error information, the error attribute information indicating correlation between the errors and a structure of the volatile memory device; and
performing a runtime repair operation with respect to the volatile memory device based on the accumulated error information and the error attribute information.

20. A storage device comprising:
a nonvolatile memory device; and
a storage controller including a volatile memory device, the storage controller configured to control an access to the nonvolatile memory device and the volatile memory device,
wherein the storage controller includes an error check and correction (ECC) engine configured to perform error detection and correction with respect to access data of the volatile memory device, and
wherein the storage controller is further configured to:
set a test operation condition of the volatile memory device for a test operation such that an error probability is increased based on the test operation condition, compared to a normal operation condition for a normal operation of the volatile memory device, the test operation condition and the test operation being set based on a manufacturer, and the normal operation condition and the normal operation being set based on a standard specification;
set a test mode with respect to a test object region corresponding to at least a portion of a memory cell array included in the volatile memory device;
set a normal mode with respect to a normal region of the memory cell array other than the test object region;
perform the test operation of the volatile memory device on the test object region based on the test operation condition during the test mode to detect error position information of errors in data stored in the test object region;
perform the normal operation of the volatile memory device on the normal region based on the normal operation condition during the normal mode; and
perform a runtime repair operation with respect to the volatile memory device based on the error position information.

* * * * *